United States Patent
Liu

(10) Patent No.: US 7,346,816 B2
(45) Date of Patent: Mar. 18, 2008

(54) METHOD AND SYSTEM FOR TESTING MEMORY USING HASH ALGORITHM

(76) Inventor: Yen-Fu Liu, No. 15-2, Lane 125, Yuan-Hua Rd., Chungli City, Taoyuan Hsien (TW)

( * ) Notice: Subject to any disclaimer, the term of this patent is extended or adjusted under 35 U.S.C. 154(b) by 330 days.

(21) Appl. No.: 10/951,664

(22) Filed: Sep. 29, 2004

(65) Prior Publication Data

US 2006/0069966 A1  Mar. 30, 2006

(51) Int. Cl.
*G11C 29/00* (2006.01)
(52) U.S. Cl. .................................... 714/718
(58) Field of Classification Search ............... 714/718, 714/719
See application file for complete search history.

(56) References Cited

U.S. PATENT DOCUMENTS

| 4,715,034 | A | * | 12/1987 | Jacobson | ................ 714/719 |
| 6,732,306 | B2 | * | 5/2004 | Dover et al. | ............ 714/719 |
| 2006/0034453 | A1 | * | 2/2006 | Liu | ........................ 380/28 |

* cited by examiner

*Primary Examiner*—James C. Kerveros
(74) *Attorney, Agent, or Firm*—Lowe Hauptman Ham & Berner LLP

(57) ABSTRACT

A method for testing a memory includes a test pattern generated by a hash algorithm. The test pattern is written into the memory and then is read from the memory. Next, the hash algorithm generates a signature using the test pattern read from the memory. Subsequently, the memory is verified by comparing the signature to a reference signature.

34 Claims, 17 Drawing Sheets

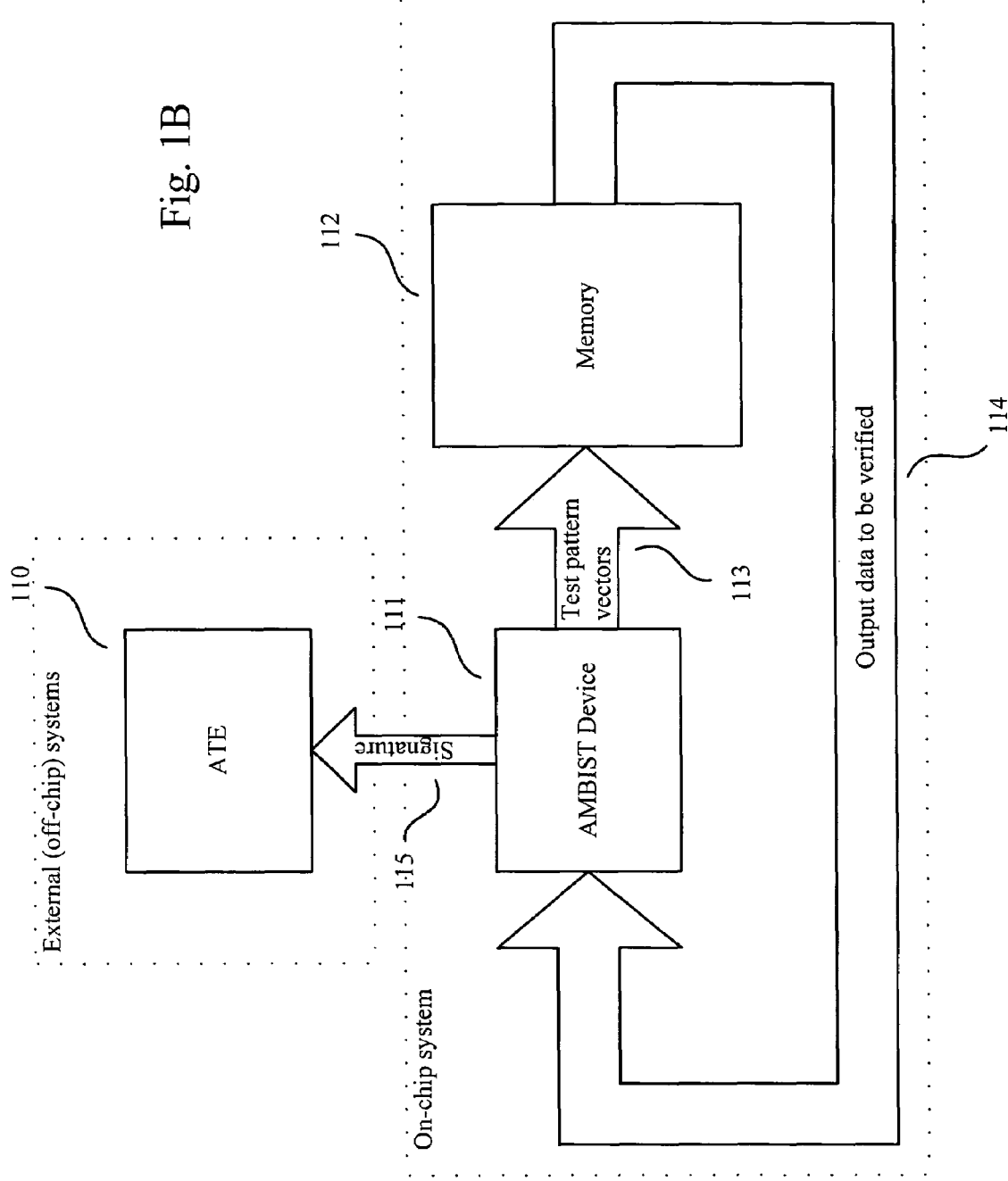

METHOD AND SYSTEM FOR TESTING MEMORY USING HASH ALGORITHM

BACKGROUND

1. Field of Invention

The present invention relates to a method and a system for testing a memory. More particularly, the present invention relates to a method and a system for testing a memory using a hash algorithm.

2. Description of Related Art

Semiconductor memory test systems traditionally employ an off-chip test methodology that relies on external test apparatuses—such as Automated Test Equipment (ATE)—for driving the test patterns and performing verification; FIG. 1A is an example of such a system. A memory device (101) receives test pattern vectors (103) from an external Automatic Test Pattern Generation (ATPG 100) hardware; then the output data (104) with previously written test vectors are read back by external hardware for verification (102) of the memory device. Both the ATPG (100) and the verification function (102) may be implemented in an ATE. Though this methodology has been a de-facto standard of memory testing, the cost remained high for the test equipment and the test time. A robust on-chip Built-In Self-Test (BIST) system can significantly reduce the test time and the cost and complexity of external test system.

SUMMARY

It is therefore an objective of the present invention to provide a method for testing a memory, where the method can significantly reduce the test time, the cost, and the complexity of external test system.

It is another objective of the present invention to provide a method for testing a memory, where the method provides both Automatic Test Pattern Generation (ATPG) and Accelerated Test Method (ATM) verification solutions.

It is still another objective of the present invention to provide a method for testing a memory, where the method generates a set of hash data pattern and the inverted value of the same set of hash data pattern to effectively detect "stuck-at" (logic-1 or logic-0) faults.

It is still another objective of the present invention to provide a method for testing a memory, where the method uses a hash algorithm to generate a signature representing the response data so that the test complexity is significantly reduced.

It is still another objective of the present invention to provide a test system for testing a memory, where the test system can be easily integrated into a chip containing the memory.

In accordance with the foregoing and other objectives of the present invention, a method for testing a memory is described. The method includes the following steps. First, a test pattern is generated by a hash algorithm. Then, the test pattern is written into the memory. Next, the test pattern is read from the memory. Following that, a signature is generated by the hash algorithm using the test pattern read from the memory. Subsequently, the memory is verified by comparing the signature to a reference signature.

In accordance with the foregoing and other objectives of the present invention, a test system for testing a memory is described. The test system includes means for generating a test pattern and means for generating a signature. The test pattern is generated by a hash algorithm and then the test pattern is written into the memory. The signature is also generated by the hash algorithm using the test pattern read from the memory. The signature is used for comparison to a reference signature to determine whether any fault occurs during the write-read operation. The test system can be embedded in a chip containing the memory.

The invention has at least the following advantages. The method described in the invention can significantly reduce the test time, the cost, and the complexity of external test system. The method can provide both Automatic Test Pattern Generation (ATPG) and Accelerated Test Method (ATM) verification solutions. The method generates a set of hash data pattern and the inverted value of the same set of hash pattern to effectively detect "stuck-at" (logic-1 or logic-0) faults. The method uses a hash algorithm to generate a signature representing the response data so that the test complexity is significantly reduced. The test system described in the invention can be easily integrated into a chip containing the memory.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 1B shows an exemplary memory test system with AMBIST embedded in a memory chip;

DESCRIPTION OF THE PREFERRED EMBODIMENTS

Figure 1A:
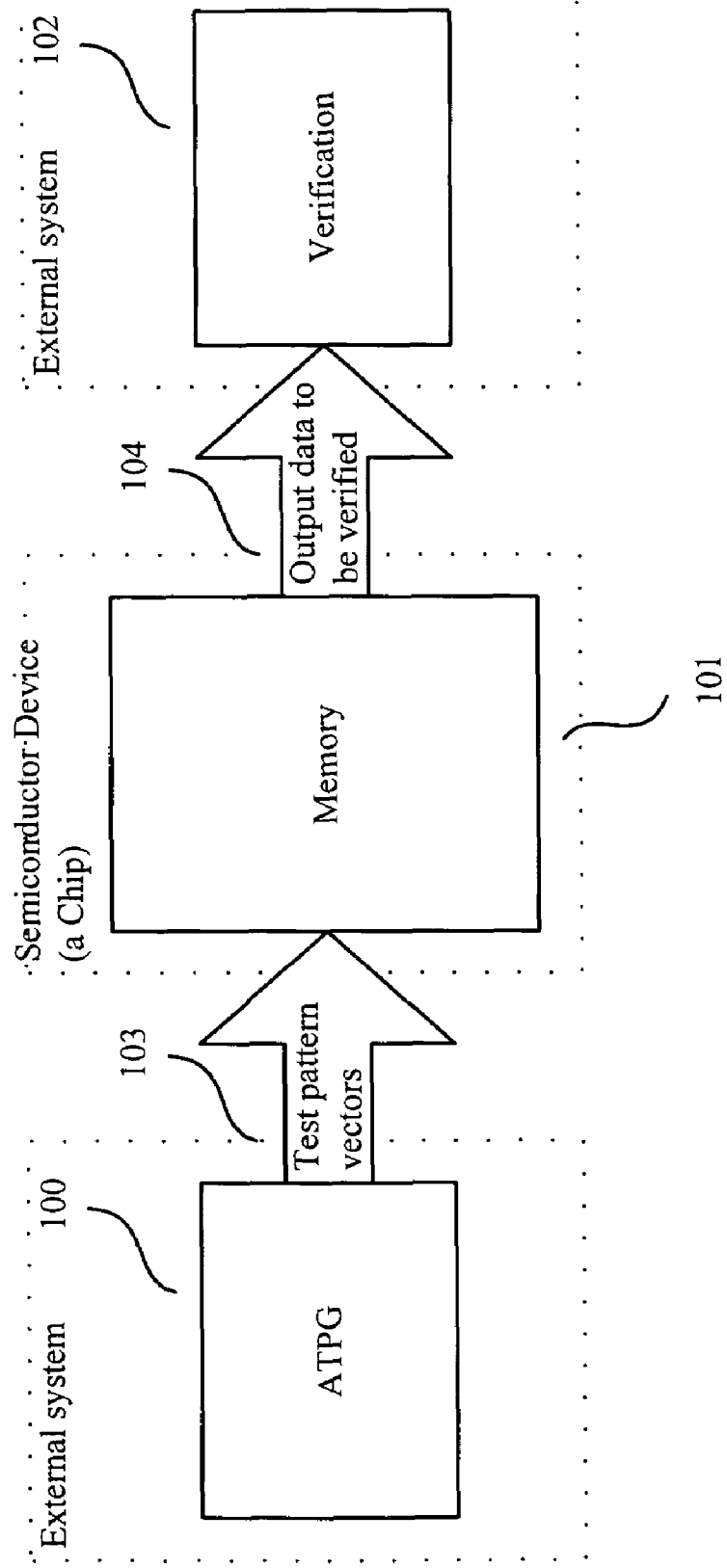
FIG. 1A is an example of an ATE based test system.

Reference will now be made in detail to the present preferred embodiments of the invention, examples of which are illustrated in the accompanying drawings. Wherever possible, the same reference numbers are used in the drawings and the description to refer to the same or like parts.

A test system and a method for testing a memory are described as follows. The test system is referred to as Accelerated Memory Built-In Self-Test (AMBIST) in the following description. Accelerated Memory Built-In Self-Test (AMBIST) system and methodology provides both Automatic Test Pattern Generation (ATPG) and Accelerated Test Method (ATM) verification solutions on a memory chip; thus, reducing test time, cost, and complexity of external test equipment.

FIG. 1B shows an exemplary memory test system with AMBIST embedded in a memory chip. In this embodiment, test pattern vectors 113 are generated with AMBIST device 111 and written into memory 112; then content of the memory 114 are read by the AMBIST device 111 and a short signature 115 representing the test result is generated. An external hardware or ATE 110 can then retrieve the signature 115 and verify the result of the memory test. For example, the result can be verified by comparing the signature to a reference signature in ATE 110.

Figure 2A:
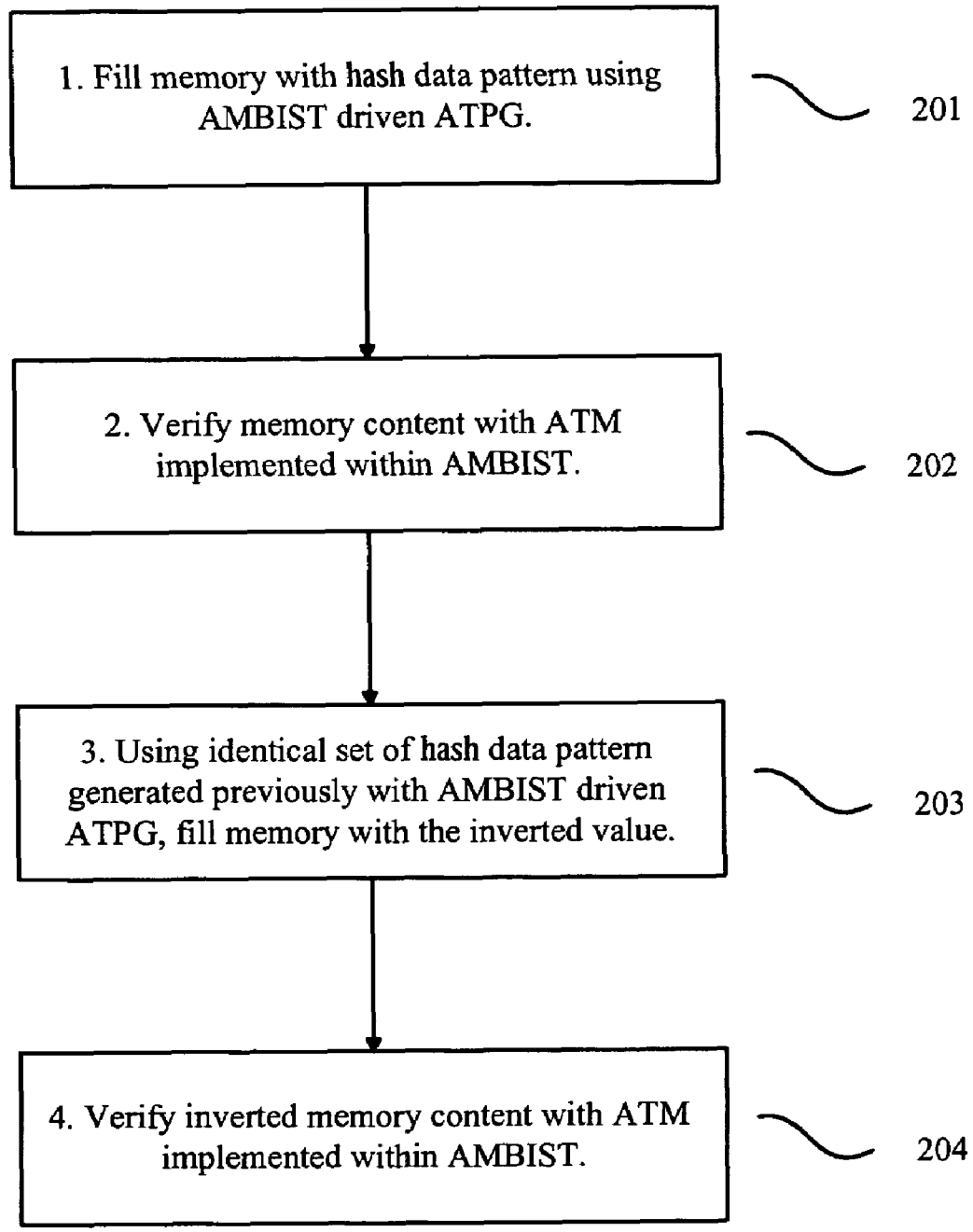
FIG. 2A is an exemplary flow chart illustrating the general procedures taken by an AMBIST system to test a memory device.

FIG. 2A is an exemplary flow chart illustrating the general procedures taken by an AMBIST system to test a memory device. In one embodiment, first, the AMBIST device fills the memory with a set of hash data pattern (step 201). Then, the memory content is read back by the AMBIST device and verified (step 202).

In another embodiment, step 203 and step 204 can be further added to the method to test the memory more precisely. In the third step, using identical set of hash data pattern generated previously in step one, the hash data pattern set is inverted and written into memory (step 203). Four, the memory content—with inverted data set—is read back by the AMBIST device and verified (step 204).

Figure 2B:
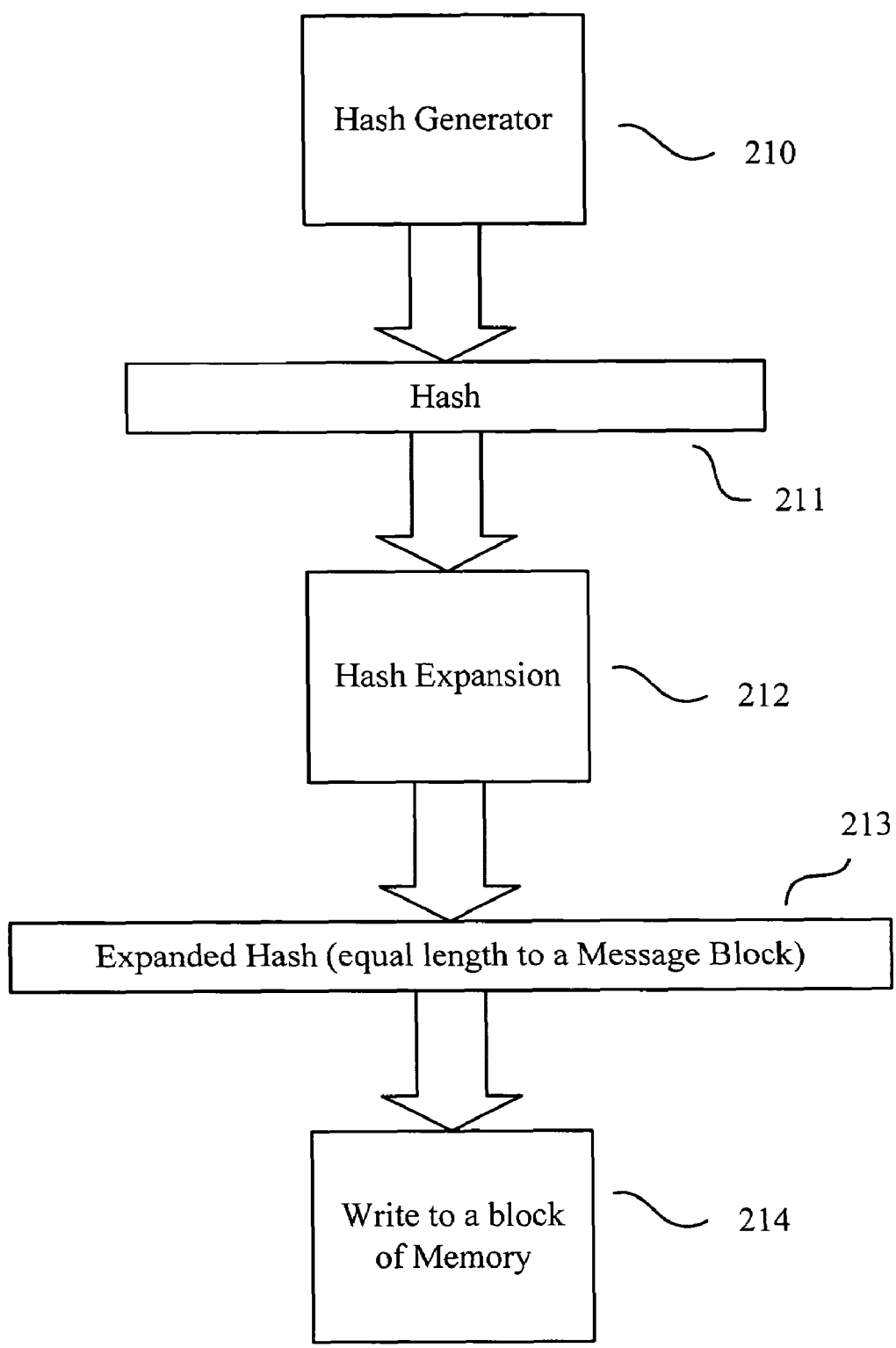
FIG. 2B, FIG. 2C, and FIG. 2D illustrate exemplary steps of an AMBIST method.
Figure 2C:
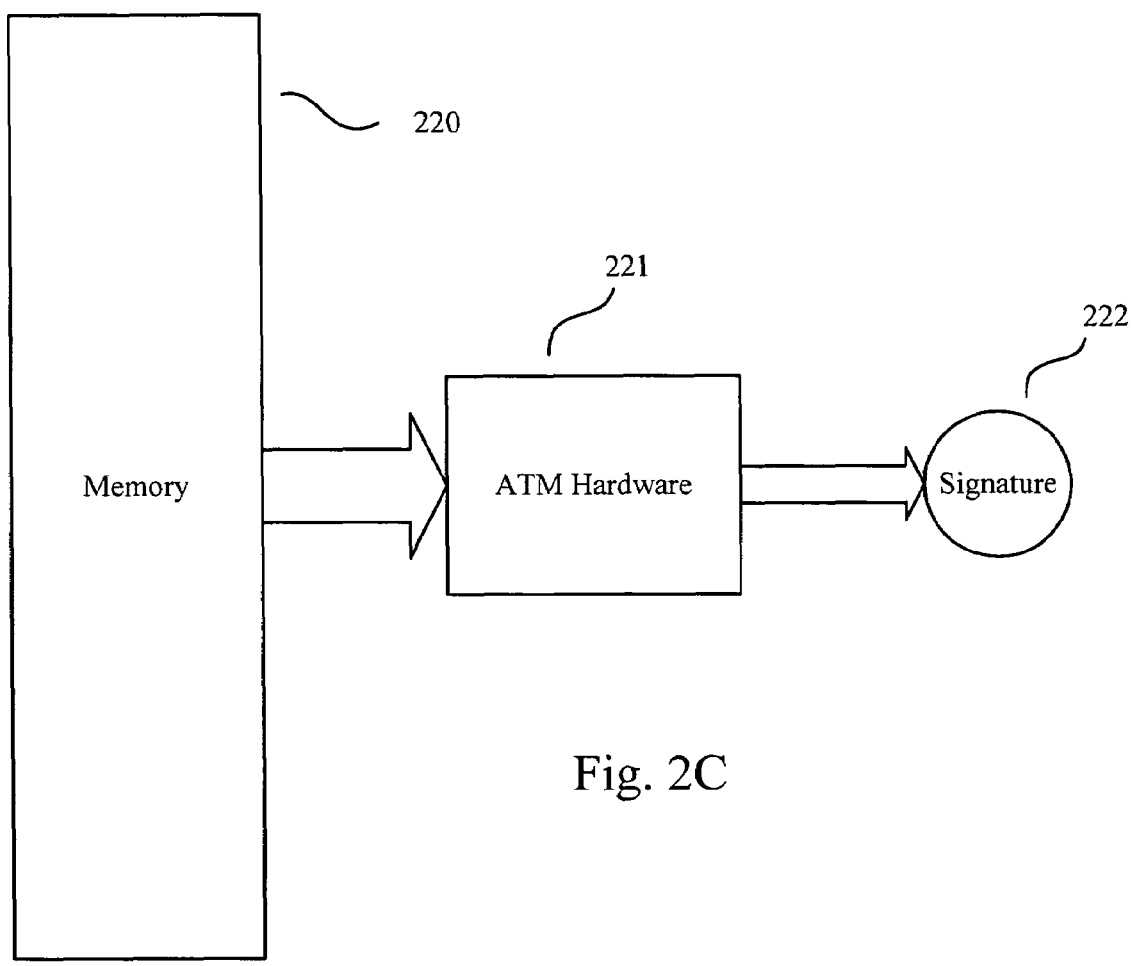
Figure 2D:
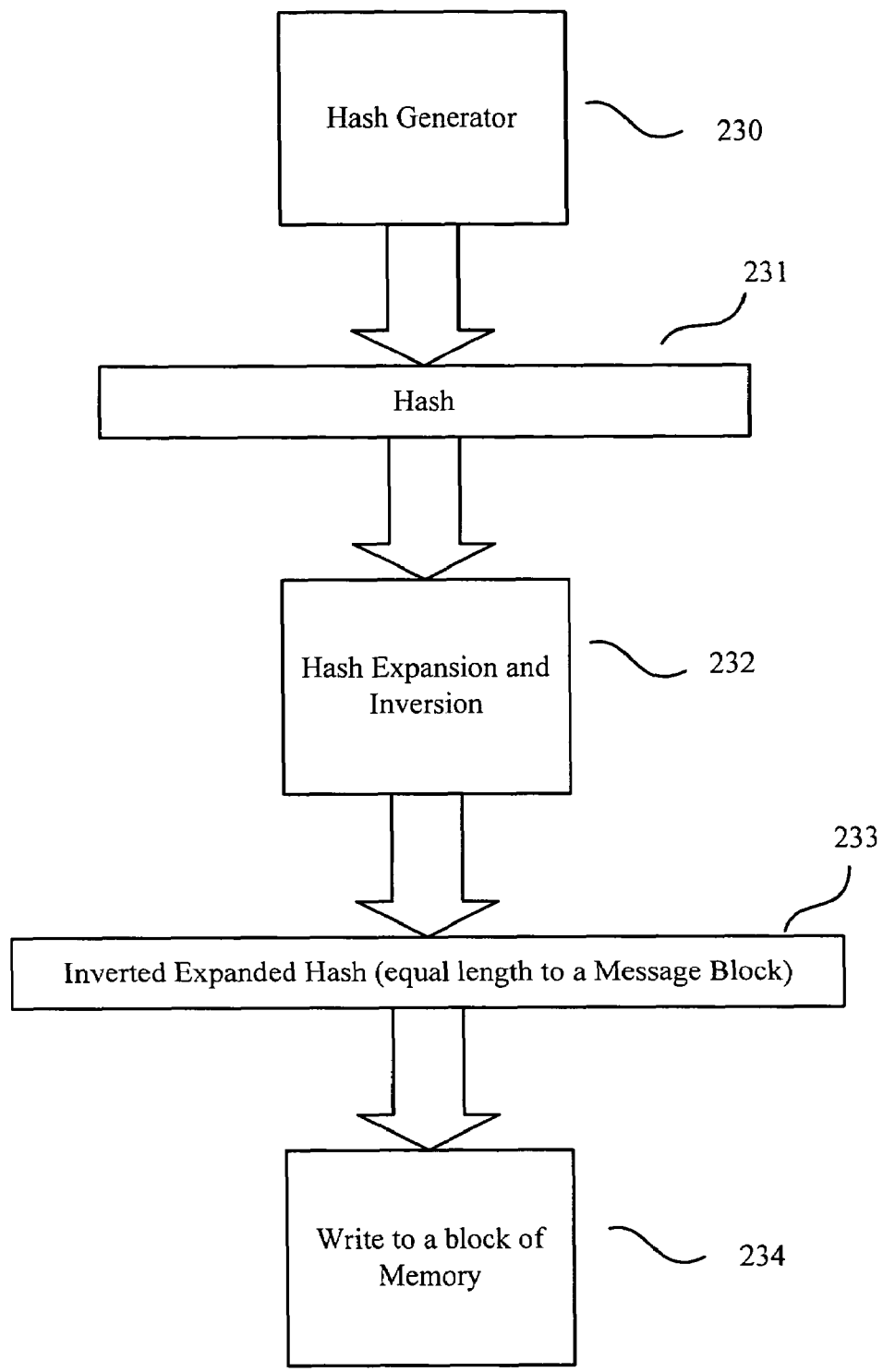
Figure 3A:
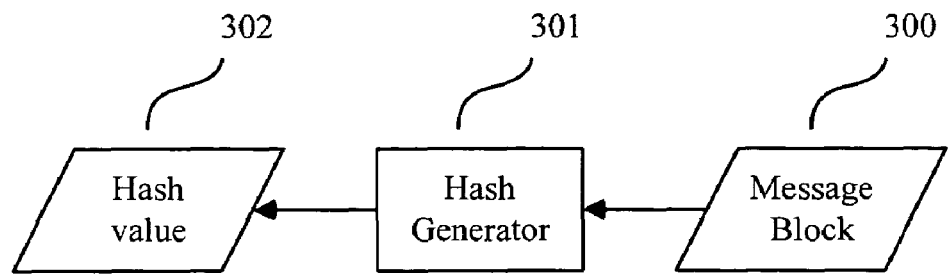
FIG. 3A is a block diagram illustrating the general concept of a hash generator.
Figure 3B:
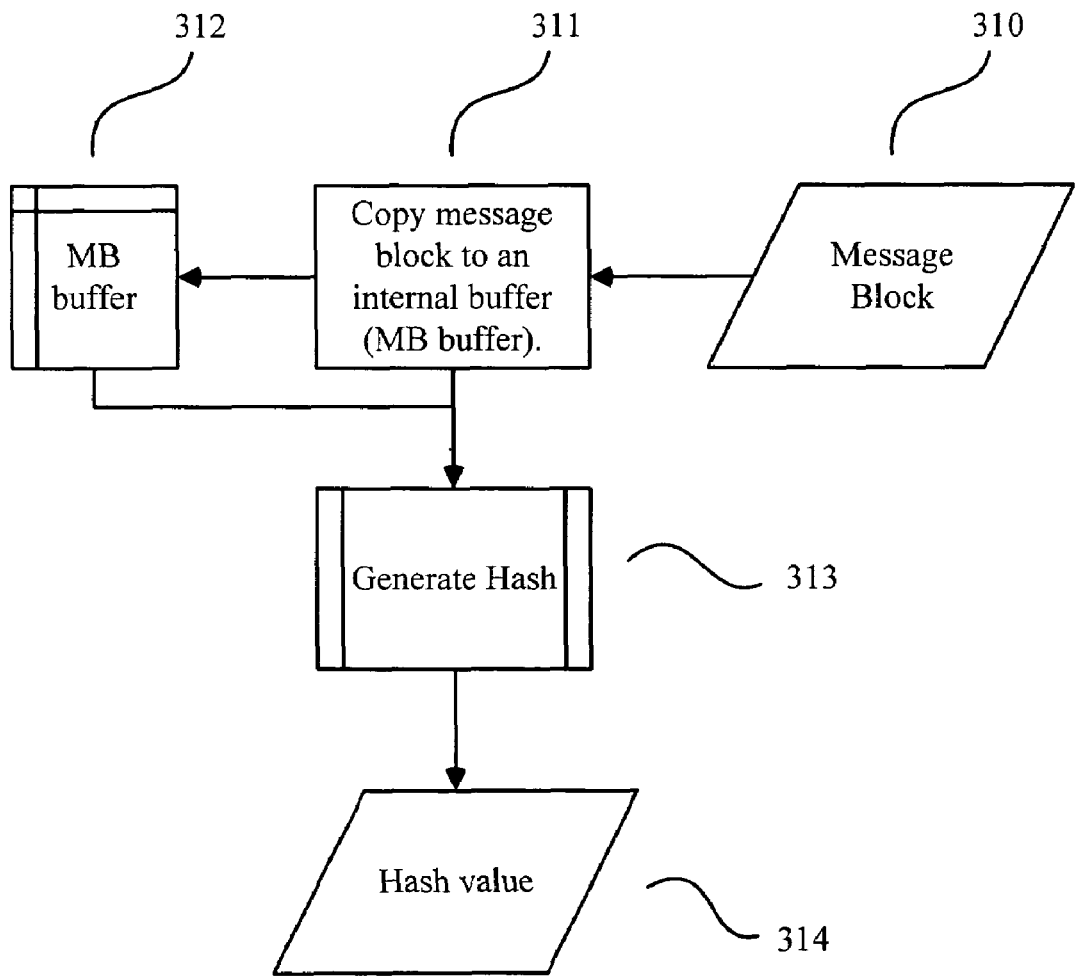
FIG. 3B illustrates exemplary internal actions of a hash generation hardware.

FIG. 3A is a block diagram illustrating the general concept of a hash generator. A hash generator takes—typically—a fixed length message block (300), and then performs a hash algorithm (step 301)—such as SHA (Secure Hash Algorithm) or MD5 (Message-Digest 5)—on the message block to produce a hash value (step 302). FIG. 3B further illustrates exemplary internal actions of a hash generation hardware. In one embodiment, a message block (step 310) is loaded (step 311) into an internal message block (MB) buffer (step 312). A hash value (step 314) is produced after a transformation process (step 313) using a hash algorithm and the MB buffer (step 312). A hash generator device is the heart of an AMBIST system. In one embodiment, the hash generator device is used in each step of the AMBIST method (step201~204). FIG. 2B, FIG. 2C, and FIG. 2D further illustrate exemplary steps of an AMBIST method in further detail.

In FIG. 2B, a hash value (step 211) is generated by a hash generator (step 210); then a hash expansion (step 212) is performed on the hash (step211) to obtain an expanded hash with a length equal to the length of the message block (step 213); finally the expanded hash (step 213) is written into a block of memory (step 214) that is equal in length to the expanded hash. In another embodiment, each hash can be written into the memory without expansion. These steps are repeated until the memory is filled with hash data generated by the hash generator; thus, completing step one of the AMBIST method (step 201).

FIG. 2C shows examples of how step two (step 202) and step four (step 204) of the AMBIST method is performed. A signature (step 222) of the memory content (step 220) is generated with an ATM hardware (step 221)—that is based on the same hash generator used in the AMBIST method.

FIG. 2D shows an example of how step three of the AMBIST method (step 203) is performed. First the hash generator (step 230) generates a hash value (step 231), the hash value is expanded and an inversion of the expanded hash value is performed (step 232), then the inverted expanded hash (step 233)—with the length equal to the length of a message block—is written to a block of memory (step 234)—that is equal in length to the expanded hash.

In essence, step one (step 201) and step two (step 202) of the AMBIST method are different to step three (step 203) and step four (step 204) only in the expanded hash value written to the memory device under test are inverted in step three (step 203) and the memory content verified in step four (step 204) are the inverted hash data pattern stored in the previous step. Testing memory with a set of hash data pattern and the inverted value of the same set of hash data pattern (each memory cell is tested with both a logic-1 and a logic-0 value) ensures the "stuck-at" (logic-1 or logic-0) faults are detected.

A general concept of an AMBIST method has been presented up to this point; with understanding of this concept, further details can now be presented in implementing a robust AMBIST system.

Figure 4A:
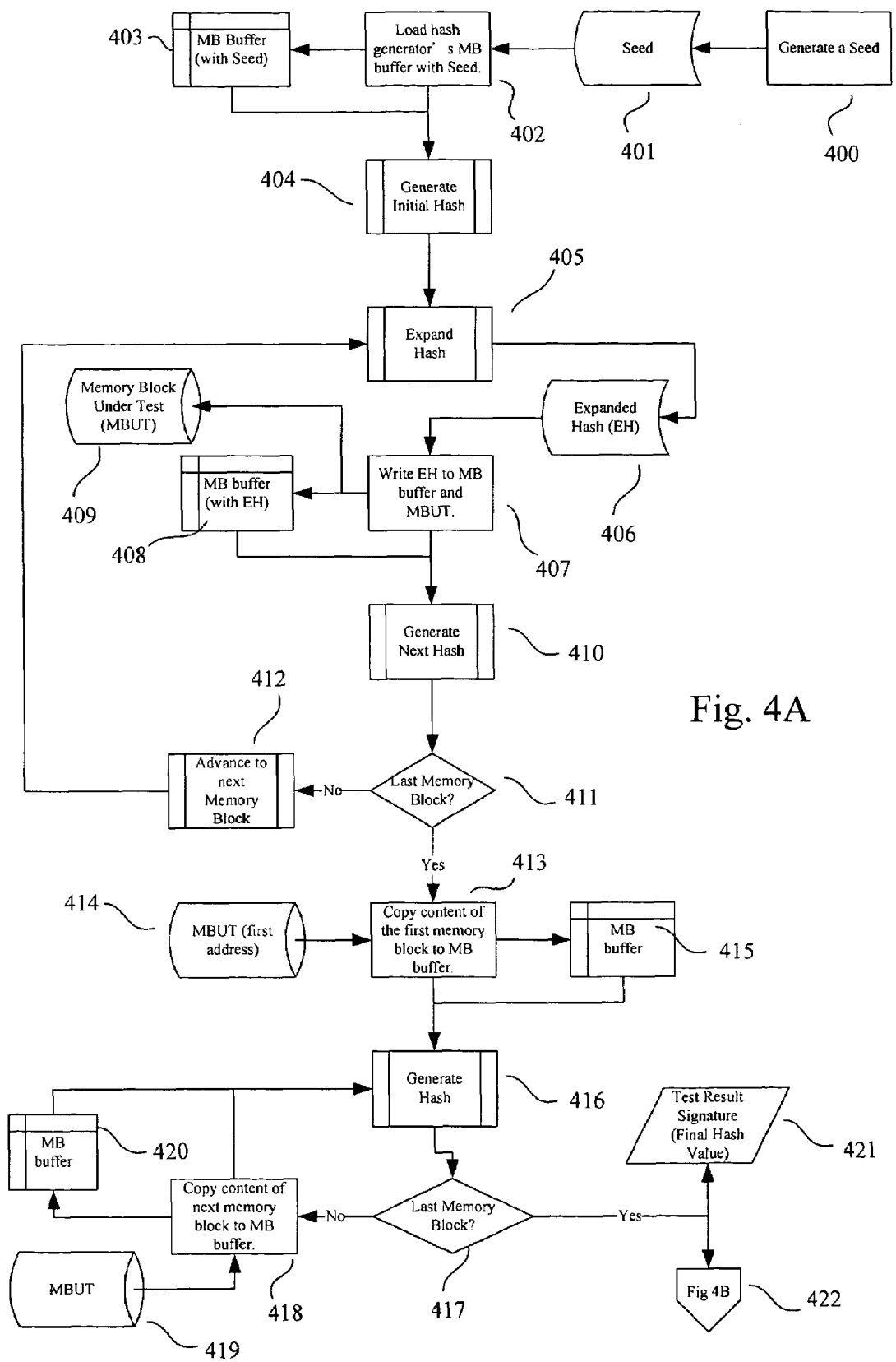
FIG. 4A and FIG. 4B are detailed flow charts illustrating an exemplary AMBIST system.
Figure 4B:
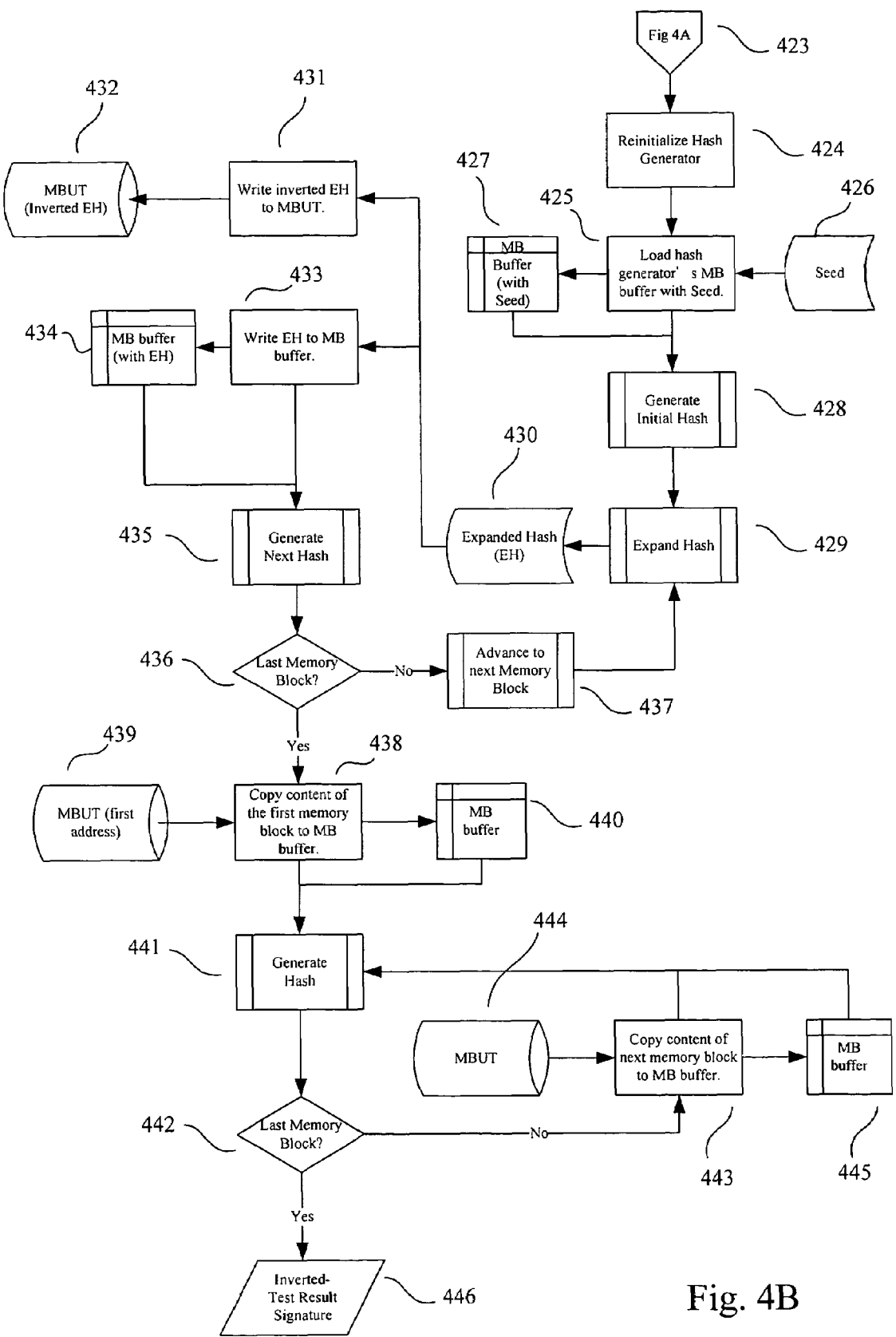

FIG. 4A and FIG. 4B are detailed flow charts illustrating an exemplary AMBIST system. First, a seed is generated (step 400). The seed (step 401) can be a pre-stored constant in the hash generator of an AMBIST device embedded within a memory chip or a constant value from an external source outside of the memory chip. In one embodiment, the length of the seed equals the length of the hash generator's message block. An AMBIST system starts with a known seed value; this known seed value will allow subsequent hash values generated—as the basic memory test vectors—to be repeatable and unique.

The next step (step 402) is to load the seed (step 401) into the message block buffer (MB buffer 403). The MB buffer (step 403) is then used to generate an initial hash value (step 404). In one embodiment, the initial hash is expanded (step 405) to equal the length of a message block; then the expanded hash (step 406) copied (step 407) to both the MB buffer (step 408) and the memory block under test (MBUT 409). The next hash value is then generated (step 410) with the content of the MB buffer (step 408)—which is the value of the previous expanded hash (step 406).

Next, a condition is tested to see if the last memory block has been written (step 411); if no, the processes starting with expanding hash (step 405) is repeated on the next memory block (step 412). If the final memory block has been written, content of the first memory block is copied to MB buffer (step 413, 414, 415); then a hash generated (step 416) with the content of MB buffer (step 415).

Next, a condition is tested to see if the last memory block has been reached (step 417); if no, content of the next memory block is copied to MB buffer (step 418, 419, 420) and the generate hash (step 416) process starts again. If the last memory block has been reached, the final hash value generated (step 416) is the test result signature (step 421) of the first portion of the test (step 201 and 202); and the test process continues with FIG. 4B (step 422). The signature generated by the first portion of the test (step 201 and 202) is referred to as a first signature. The first signature can be compared to a first reference signature to verify the result of the first portion of the test.

Continuing from FIG. 4A (step 423), first, the hash generator can be reinitialized with default values (step 424); the MB buffer is then loaded with the seed (step 425, 426, 427); and an initial hash generated (step 428) with the seed in MB buffer (step 427). The prior steps (step 424-428) ensures a set of test pattern identical to the test pattern set generated previously—in the first test portion (step 201 and 202)—is repeated for this second portion of the memory test (step 203 and 204). Next, the initial hash is expanded (step 429) to make an expanded hash value (step 430)—with its length equal to the length of the hash generator's message block. The expanded hash (step 430) is, next, copied to MB buffer (step 433 and 434) and the inverted value of expanded hash is copied to the memory block under test (step 431 and 432); then the next hash value is generated with the content of MB buffer (step 435 and 434). Next, a condition is tested to determine if the final memory block is reached (step 436); if no, the test is advanced to the next memory block (step 437) and the test processes starting from expanding hash (step 429) are repeated again. If the final memory block has been reached (step 436), the test processes continue with copying content of the first memory block to MB buffer (step 438, 439, 440); and the hash generator continues with hash generation (step 441) using the MB buffer (step 440). Next, a condition is tested to determine if the final memory block is reached (step 442); if no, content of the next memory block is copied to MB buffer (step 443, 444, 445) and the test processes starting at generating hash (step 441)—with content of MB buffer (step 445)—start over again. If the final memory block has been reached (step 442), the final hash value generated (step 441) is the test result signature (step 446) of the second portion of the test (step 203 and 204); and the AMBIST is completed. The signature generated by the second portion of the test is referred to as a second signature. The second signature can be compared to a second reference signature to verify the result of the second portion of the test. The first portion alone can be used to verify the memory without performing the second portion of the test. However, with the second portion of the test, the test result will be more accurate.

AMBIST method relies on the quality of the hash test pattern data set—generated by the hash generator with a good quality hash algorithm—for detecting memory device faults. AMBIST can detect nearly 100% of "stuck-at" logic-1 or logic-0 faults; and with good quality hash test pattern, other types of memory faults can also be detected with high probability; it is unlikely that with any faults in a memory chip, a unique set of good quality hash pattern written to the memory device can remain the same when later read back from the memory.

However, if necessary, the probability of memory fault detection can be increased even further by repeatedly testing the memory device under test with different sets of hash patterns by using different seeds at the start of each test; a hash generator with a good quality algorithm shall be able to generate unique sets of hash test data when started with different seeds. Secure Hash Standard (SHS) and MD5, for example, are proven good quality hash algorithms for an AMBIST hash generator. The hash algorithm can be SHA-1, SHA-224, SHA-256, SHA-384, or SHA-512. SHA-256 and SHA-512, in particular, are recommended algorithms for AMBIST implementation.

Figure 2E:
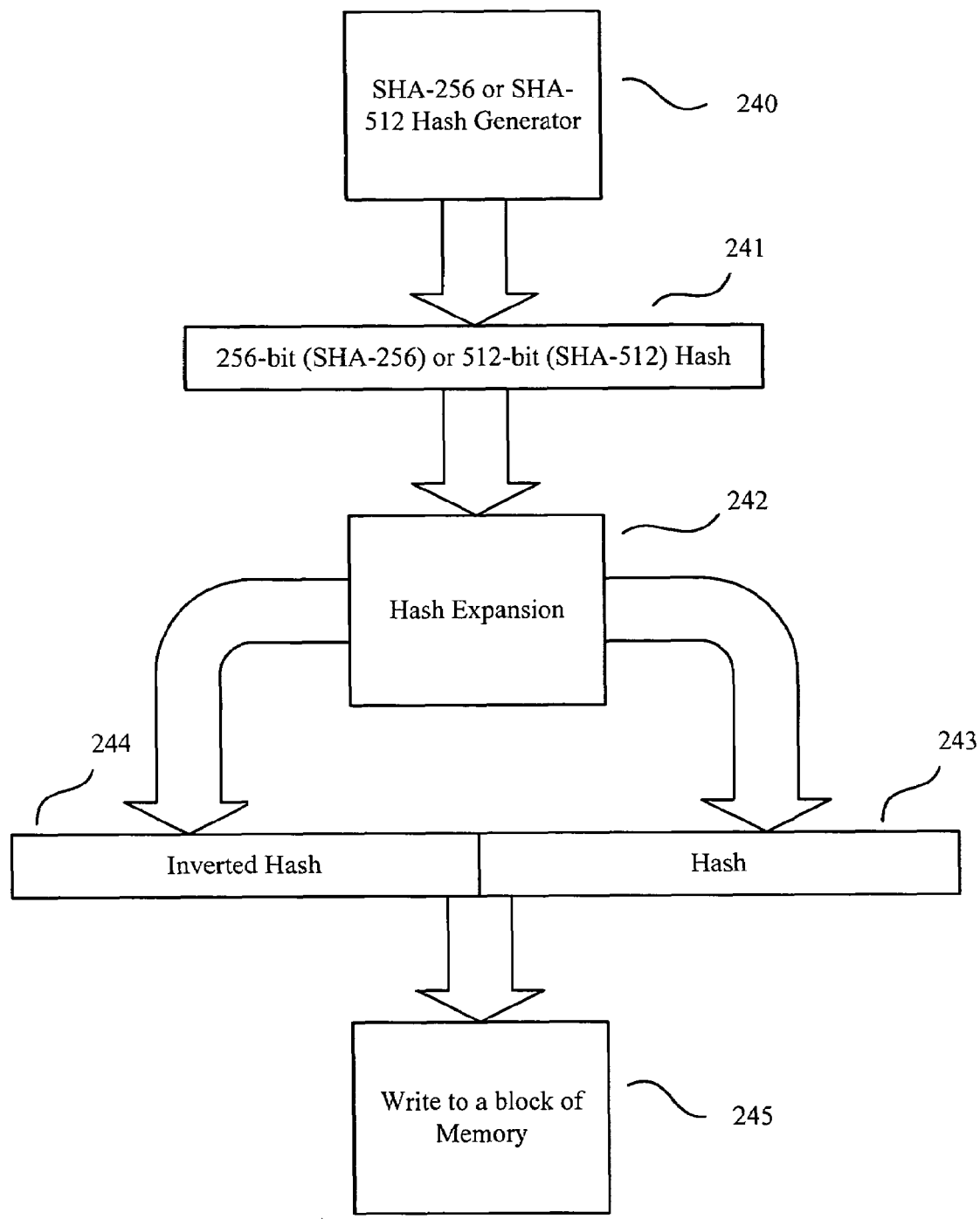
FIG. 2E is a diagram illustrating exemplary steps to expand a hash value.
Figure 2F:
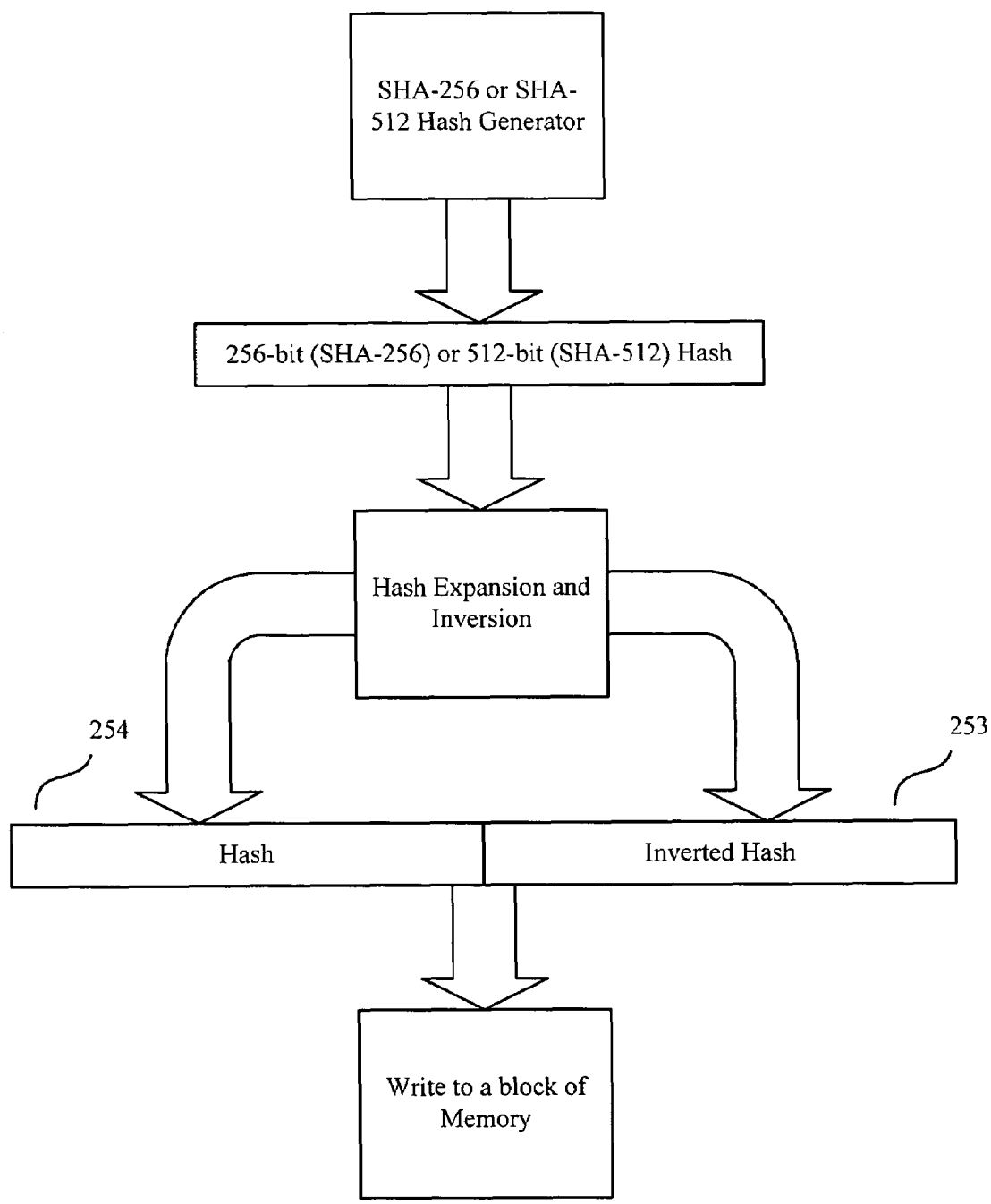
FIG. 2F is a diagram illustrating exemplary steps to invert an expanded hash value.

SHA-256 takes a 512-bit message block and produces a 256-bit hash, and SHA-512 takes a 1024-bit message block and produces a 512-bit hash. The proportioned relationship of the sizes of the hash and the message block (a 1:2 ratio) made these two algorithms ideal for implementing a highly efficient hash expansion method. In FIG. 2E, for example, a hash value (step 241) is generated by a hash generator implementing SHA-256 or SHA-512 (step 240); the hash is then expanded (step 242) simply by concatenating the hash value (step 243) and an inverted value of the hash (step 244) to make an expanded hash with the length equal to the message block's. The expanded hash is then written to a block of memory with the length equal to the expanded hash's (step 245). For testing a memory with inverted test vectors, simply swap the positions of the hash and the inverted hash in an expanded hash value as shown in FIG. 2F (step 253 and 254).

The above method of implementing hash expansion with SHA-256 and SHA-512 is a good example of efficient implementation of hash expansion assuming the data input and the data output of the memory device under test has equal width. However, method of hash expansion is not limited to the above example; there are many possible ways to implement hash expansion. Some special memory devices may even have different input and output data widths. In an AMBIST system, the output of the expanded hash is for the input data lines of the memory under test and the message block buffer input takes the output data lines of the memory under test. The I/O interfaces between the memory data and the hash generator data can have many possible arrangements as well; AMBIST method has no strict requirement regarding the arrangement of the memory's I/O interface. For example, when the size of memory data I/O is different from the size of hash generator data I/O, an interfacing layer of logics may be implemented to bridge the interfaces.

FIG. 5A, FIG. 5B, FIG. 5C, and FIG. 5D show an example of an ideal arrangement of an AMBIST system based on a SHA-256 hash generator hardware. With reference to FIG. 5A, FIG. 5B, FIG. 5C, and FIG. 5D, in this embodiment, sixteen banks of RAM (500~515) are tested in parallel; each RAM with 32-bit data I/O interfaces. The 32-bit data output of all the sixteen RAM units are concatenated to form a 512-bit data-output to go into the 512-bit message block buffer of the AMBIST device 520. The 512-bit expanded hash output from the AMBIST device dout 521 are split into sixteen 32-bit data outputs to connect to the 32-bit data inputs of the sixteen RAM units (500-515). Signal wm (connection line 523) can be used to enable each RAM unit. Signal a_RAM (connection line 522) serves as an address for writing data into each RAM unit. Such architecture of utilizing all available AMBIST data I/O and directly connecting RAM and AMBIST data I/O without using bridging hardware, allows AMBIST to perform at the most efficient level.

Figure 5A:
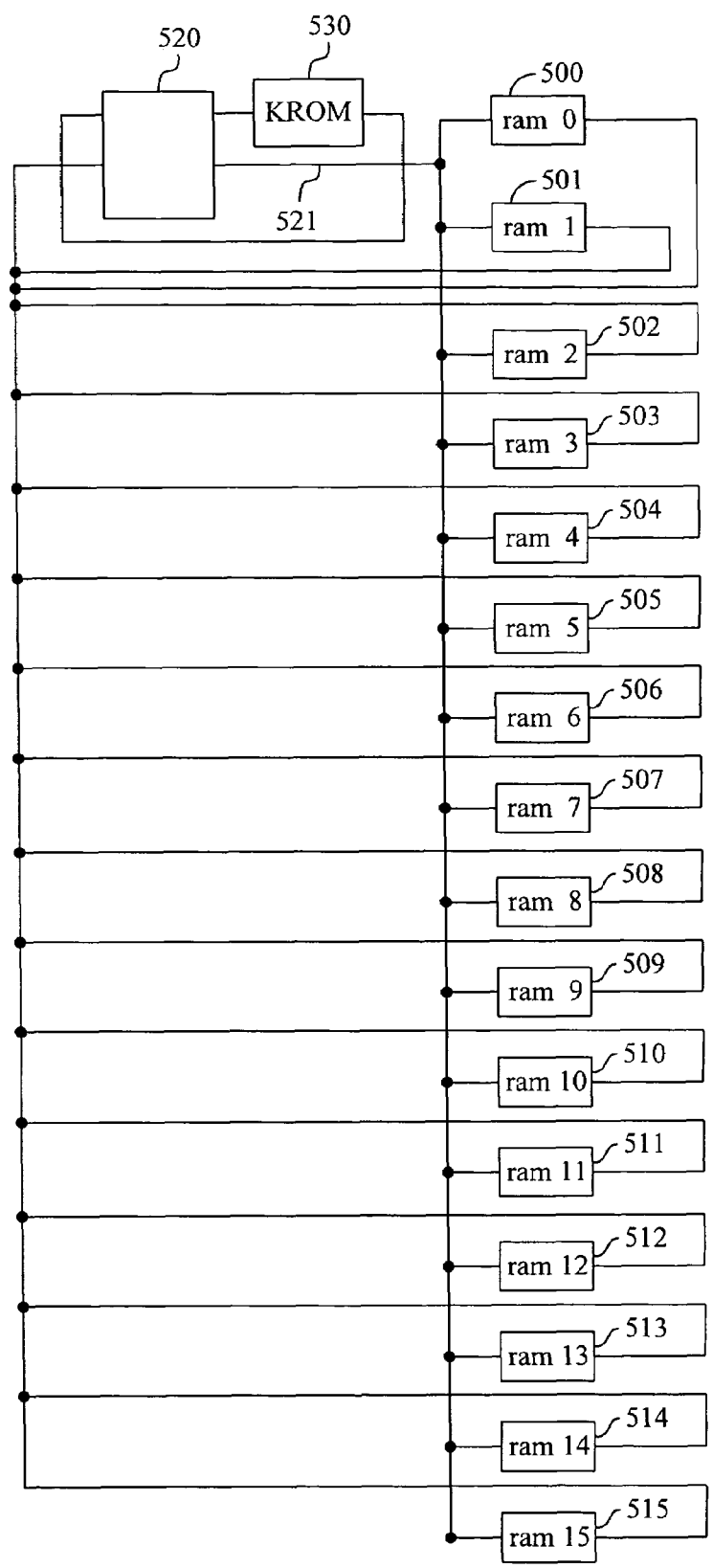
FIG. 5A, FIG. 5B, FIG. 5C, and FIG. 5D show an example of an ideal arrangement of an AMBIST system based on a SHA-256 hash generator hardware.
Figure 5B:
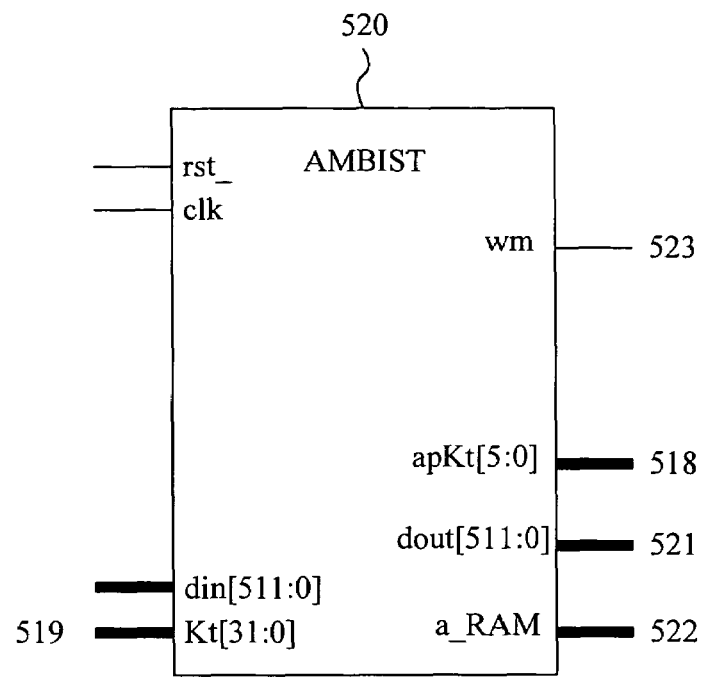
Figure 5C:
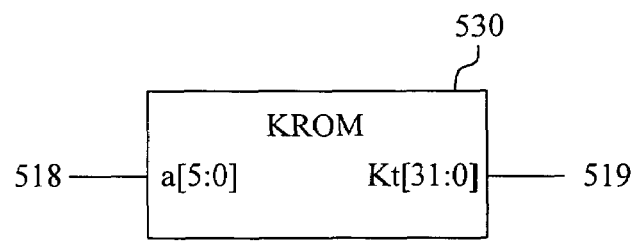
Figure 5D:
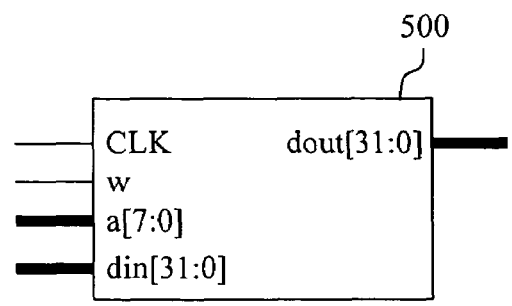

A memory, such as a read-only memory, can be used to store the Kt parameters. The memory is referred to as KROM 530 in the following description. KROM 530 is not limited to a read-only memory. Any memory that can store Kt parameters can be used as KROM 530. As shown in FIG. 5A, KROM 530 supplies the Kt parameter to the SHA-256 based hash generator.

The SHS algorithms are perhaps the most suitable hash algorithms for implementing an AMBIST system; SHA-256 and SHA-512, in particular, are probably the most ideal. System and method of efficiently implementing SHA-1 in digital hardware that accomplishes optimal computation speed using minimal hardware resources has already been disclosed in previous U.S. utility patent application Ser. No. 10/704,678; the method and the core architecture of this system can readily be applied to the new SHS algorithms—SHA-224, SHA-256, SHA-384, and SHA-512.

Figure 6A:
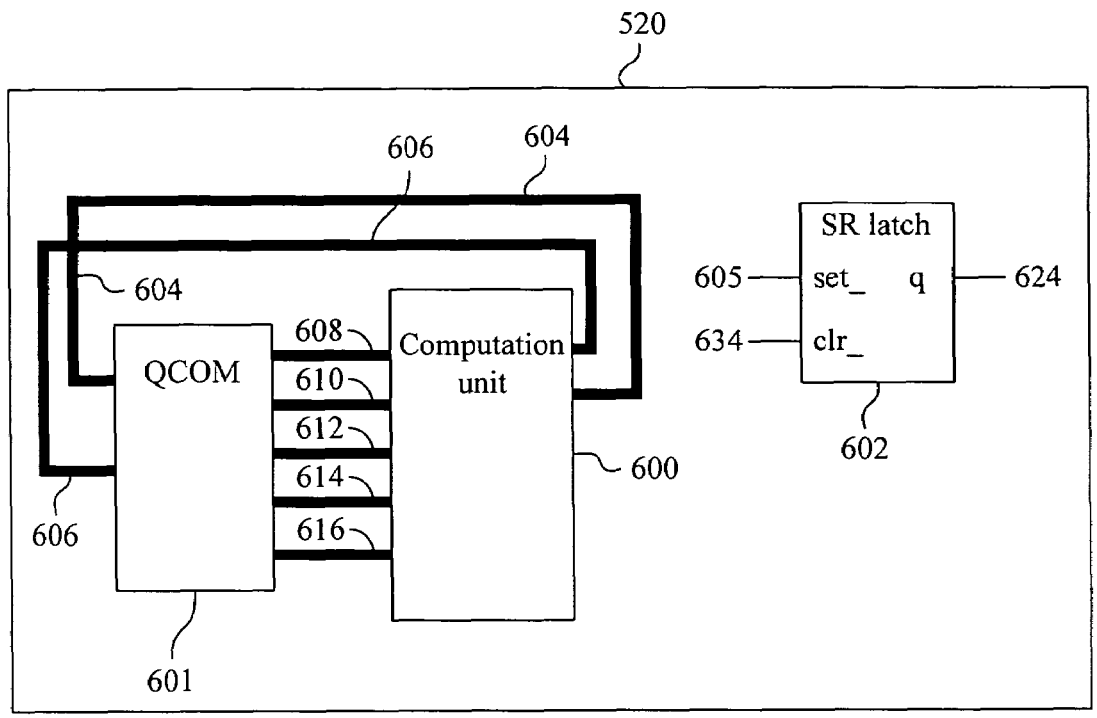
FIG. 6A shows the top block view of an exemplary accelerator hardware adopting SHA-256.
Figure 6B:
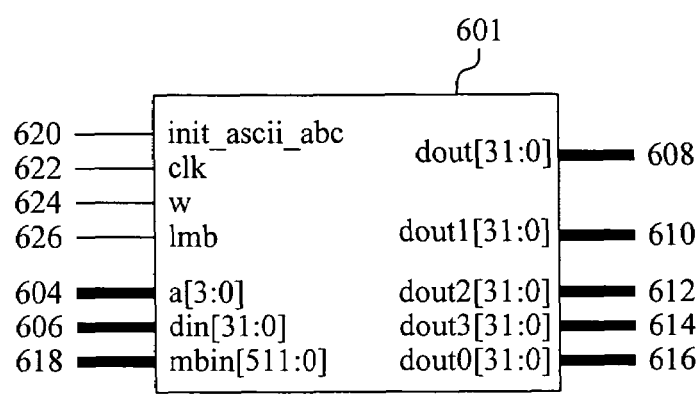
FIG. 6B is a diagram illustrating details of QCOM 601.
Figure 6C:
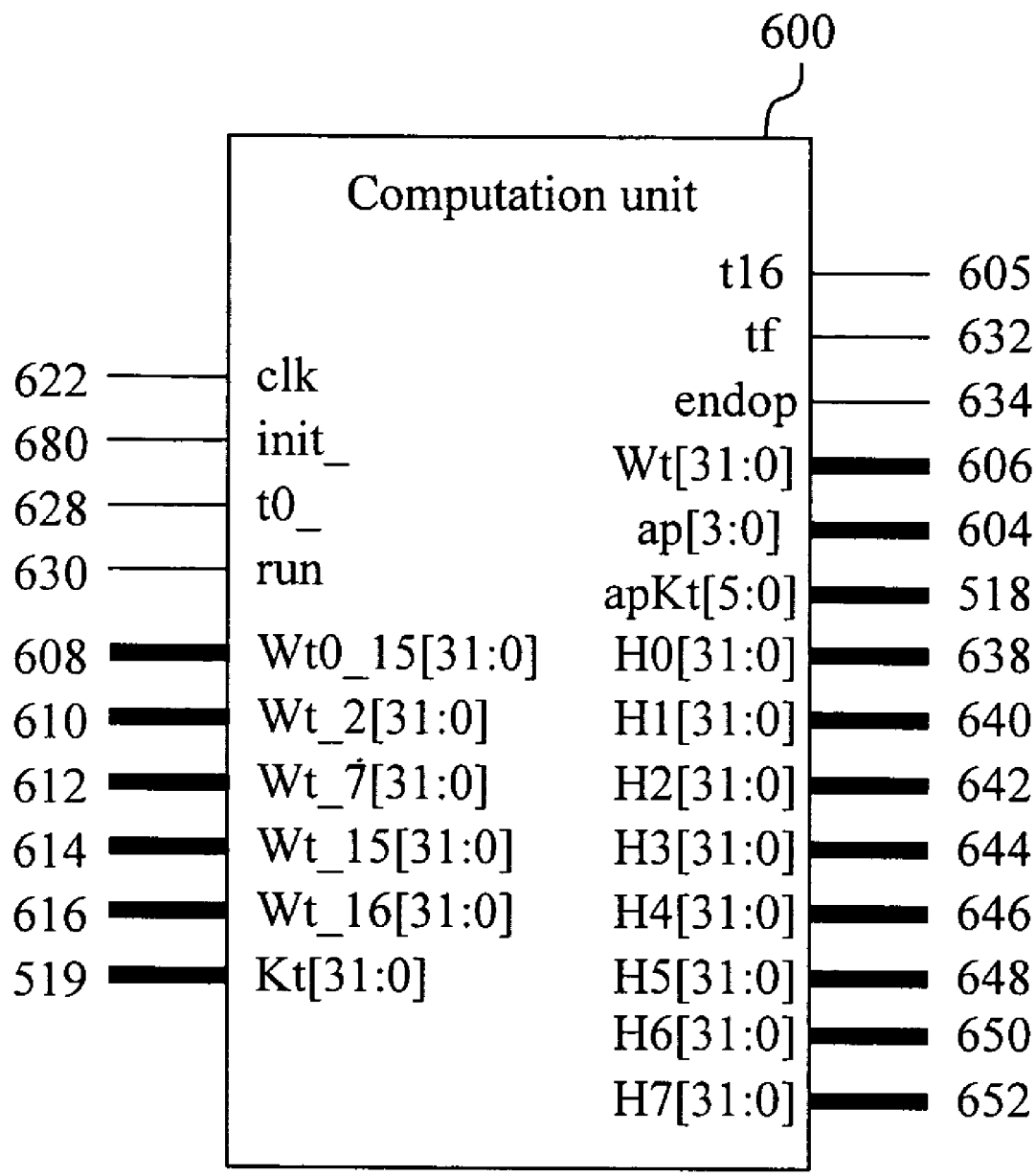
FIG. 6C is a diagram illustrating details of computation unit 600.

FIG. 6A shows the top block view of an exemplary accelerator hardware adopting SHA-256. FIG. 6B is a diagram illustrating details of QCOM 601. FIG. 6C is a diagram illustrating details of computation unit 600. With reference to FIG. 6A, FIG. 6B, and FIG. 6C, the SHA-256 accelerator hardware has a Quad-Channel-Output Memory (QCOM 601) simultaneously supplying four Wt data parameters (Wt-2, Wt-7, Wt-15, and Wt-16) to the SHA-256 logic and computation unit 600. QCOM 601 can also serve as a message block buffer mentioned above. The core architecture of the QCOM 601 that gives its ability to supply four data parameters simultaneously is as already illustrated in the U.S. patent application Ser. No. 10/704,678 and will not be illustrated in detail again.

Some of the logic and mathematic operations of the new SHA-224, SHA-256, SHA-384, and SHA-512 are different from those of SHA-1; the most notable difference being SHA-1 uses just four 32-bit Kt values in four twenty-sequence rounds of the first eighty sequences—out of the total eighty-one sequences—of the hash computation, but the new SHS algorithms (SHA-224, SHA-256, SHA-384, and SHA-512) use different Kt values for every sequence except the last sequence of the hash computation. SHA-256 and SHA-224 uses sixty-four 32-bit Kt values for the first sixty-four hash computation sequences—out of the total sixty-five sequences.

SHA-384 and SHA-512 both use the same set of eighty 64-bit Kt values for the first eighty hash computation sequences—out of the total eighty-one sequences (note that a sequence was referred to as a step in the prior U.S. Ser. No. 10/704,678 document). In this embodiment, a memory unit is implemented to supply the Kt parameter to the SHA-224, SHA-256, SHA-384, or SHA-512 based hash computation unit 600. The memory unit can be a KROM 530 with either sixty-four 32-bit words (SHA-224 and SHA-256) or eighty 64-bit words (SHA-384 and SHA-512) of Kt values stored in memory locations corresponding to the sequence number of each Kt. The hash computation unit 600 outputs the sequence number with the apKt signal (connection line 518)—connected to the address port (connection line 518) of KROM 530 where Kt values are stored—to retrieve a corresponding Kt value from KROM 530 where Kt values are stored.

The top level architecture of the SHA-256 hardware accelerator (FIG. 6A) can be applied to SHA-224, SHA-512, and SHA-384 with minimal changes. The SHA-256 accelerator as shown in FIG. 6A, FIG. 6B, and FIG. 6C has 32-bit wide data buses, these data buses are: Wt0_15 (connection line 608), Wt_2 (connection line 610), Wt_7 (connection line 612), Wt_15 (connection line 614), Wt_16 (connection line 616), Kt (connection line 519), Wt (connection line 606), H0 (connection line 638), H1 (connection line 640), H2 (connection line 642), H3 (connection line 644), H4 (connection line 646), H5 (connection line 648), H6 (connection line 650), and H7 (connection line 652) on the computation unit 600 and din (connection line 606), dout (connection line 608), dout1 (connection line 610), dout2 (connection line 612), dout3 (connection line 614), and dout0 (connection line 616) on the QCOM 601; these 32-bit data buses are increased to 64-bit wide when implementing SHA-512 accelerator; when implementing SHA-224, H7 (connection line 652) port is removed; when implementing SHA-384, H6 (connection line 650) and H7 (connection line 652) ports are removed and all the other 32-bit ports are increased to 64-bit wide. The SHA-256 computation unit 600 has a 6-bit apkt (connection line 518) (for sixty-four Kt values); SHA-224 uses a 6-bit apkt as well; when implementing SHA-512 or SHA-384, apKt (connection line 518) is increased to 7-bit wide. In addition, both the 512-bit mbin input (connection line 618) and the memory capacity of QCOM '601 are increased to 1024-bit when implementing SHA-512 or SHA-384 accelerator.

Three new input ports added to the QCOM 601 were not mentioned in the prior art (U.S. Ser. No. 10/704,678); they are: init_ascii_abc_(connection line 620), lmb (connection line 626), and mbin (connection line 618). These signals will not affect or alter the hash computation processes of the SHS accelerator. The init_ascii_abc_(connection line 620) initializes the memory to a default message block value—a message block containing ASCII characters "abc" for example—that can also be used as an AMBIST default seed or a self-test message block. The mbin (connection line 618) bus allows all memory cells in QCOM 601 to be written all at once when enabled by the lmb (connection line 626) signal. All other QCOM signals 601 are identical to the prior art (U.S. Ser. No. 10/704,678) in the functionality. The 'din' (connection line 606) is a word-size (32-bit for SHA-1/SHA-224/SHA-256 or 64-bit for SHA-384/SHA-512) data input, value of din (connection line 606) is synchronously written—on a clock edge of 'clk' (connection line 622)—to the memory word pointed by the 'a' (address) (connection line 604) signal when enabled by the 'w' (write) (connection line 624) signal. Signal buses dout (connection line 608), dout1 (connection line 610), dout2 (connection line 612), dout3 (connection line 614), and dout0 (connection line 616) are word-size (32-bit for SHA-1/SHA-224/SHA-256 or 64-bit for SHA-384/SHA-512) data outputs. The memory content pointed by 'a' (connection line 604) is driven out on dout (connection line 608).

The memory content pointed by 'a+14' is driven out on dout1 (connection line 610); this is the Wt-2 value; however, the same data output channel was named Wt_3 in the prior art (U.S. Ser. No. 10/704,678), and value of Wt-3 (memory content pointed by 'a+13') was driven out this channel. The memory content pointed by 'a+9' is driven out on dout2; this is the Wt-7 value; however, the same data output channel was named Wt_8 in the prior art (U.S. Ser. No. 10/704,678), and value of Wt-8 (memory content pointed by 'a+8') was driven out this channel. The memory content pointed by 'a+1' is driven out on dout3; this is the Wt-15 value; however, the same data output channel was named Wt_14 in the prior art (U.S. Ser. No. 10/704,678), and value of Wt_14 (memory content pointed by 'a+2') was driven out this channel. The dout0 channel drives out the value of Wt-16 which is equivalent to Wt-0 with the 16 word memory, therefore, dout0 and dout share the same output channel; dout0 was named Wt_16 in the prior art (U.S. Ser. No. 10/704,678).

SHA-224, SHA-256, SHA-384, and SHA-512 are different only in data sizes, constant values, and some mathematical functions; the processes of hash computation using mathematic functions, constant values, and data parameters are identical. The computation unit 600 provides a universal architecture that can implement any of SHA-224, SHA-256, SHA-384, or SHA-512 in the most efficient manner. The detailed architecture of the computation unit (600) will be disclosed in later sections. With reference to FIG. 6C, the interfaces of this computation unit 600 and its functions will be described next; signals: clk (connection line 622), init_ (connection line 680), t0_(connection line 628), run (connection line 630), Wt0_15 (connection line 608), Wt_2 (connection line 610), Wt_7 (connection line 612), Wt_15 (connection line 614), Wt_16 (connection line 616), Kt (connection line 519), t16 (connection line 605), ff (connection line 632), endop (connection line 634), Wt (connection line 606), ap (connection line 604), apKt (connection line 518), H0 (connection line 638), H1 (connection line 640), H2 (connection line 642), H3 (connection line 644), H4 (connection line 646), H5 (connection line 648), H6 (connection line 650), H7 (connection line 652) will be described in further detail. Also note that the sequence number of the hash computation processes will be represented as 'T' in later discussions. For example, SHA-224 and SHA-256 have sixty-five hash computation sequences and will be represented by T=1 to T=65; SHA-384 and SHA-512 have eighty-one hash computation sequences and will be represented by T=1 to T=81.

1. Clk (connection line 622): Is a clock signal.
2. init_(connection line 680): Initializes (or reset) internal registers to the default value.
3. t0_(connection line 628): Clearing an internal counter to value of zero.
4. run (connection line 630): This signal should be active from start to end of the hash computation. It can be activated by an external command or an external signal to start hash computation on a message block and deactivated by the ff (connection line 632) signal.
5. ff (connection line 632): Representing T=64 for SHA-256 and SHA-224 or T=80 for SHA-384 and SHA-512. The run signal can be deactivated on a clock edge when this signal is active.
6. ap (connection line 604): Address pointer for retrieving word size data parameters from QCOM 601 or writing a data word to QCOM 601.
7. Wt0_15 (connection line 608): Connected to dout (connection line 608) of QCOM 601, the data is used by the computation unit 600 for T=1 to T=16.
8. Wt_2 (connection line 610): Connected to dout1 of QCOM 601; it's the value of Wt-2.
9. Wt_7 (connection line 612): Connected to dout2 of QCOM 601; it's the value of Wt-7.
10. Wt_15 (connection line 614): Connected to dout3 of QCOM 601; it's the value of Wt-15.
11. Wt_16 (connection line 616): Connected to dout0 of QCOM 601; it's the value of Wt-16.
12. Wt (connection line 606): Representing a computation result involving Wt-2, Wt-7, Wt-15, and Wt-16 parameters.
13. t16 (connection line 605): Representing T=17. This signal sets the output of an S/R latch 602 to activate the w (write) (connection line 624) signal of QCOM 601.
14. endop (connection line 634): Representing T=65 for SHA-256 and SHA-224 or T=81 for SHA-512 and SHA-384, this signal clears the output of the S/R latch 602 to deactivate the w (write) (connection line 624) signal of QCOM 601. The Wt output (connection line 606) is written to the QCOM 601 when the write signal (w) (connection line 624) is active from T=17 to T=64 (SHA-256 or SHA-224) or T=80 (SHA-384 or SHA-512).
15. Kt (connection line 519): Connected to KROM 530, the Kt data parameter is supplied to the computation unit 600.
16. apKt (connection line 518): An address pointer connected to KROM 530 where all the Kt constants are stored, a Kt value pointed by apKt is driven out to the data output of KROM 530.
17. H0, H1, H2, H3, H4, H5, H6, and H7 (connection line 638~652): The results of SHS hash computation; each output is a 32-bit word for SHA-256 or SHA-224 or a 64-bit word for SHA-512 or SHA-384; further more, SHA-224 does not have H7 port (connection line 652) and SHA-384 does not have H6 and H7 ports (connection line 650, 652).

Figure 7A:
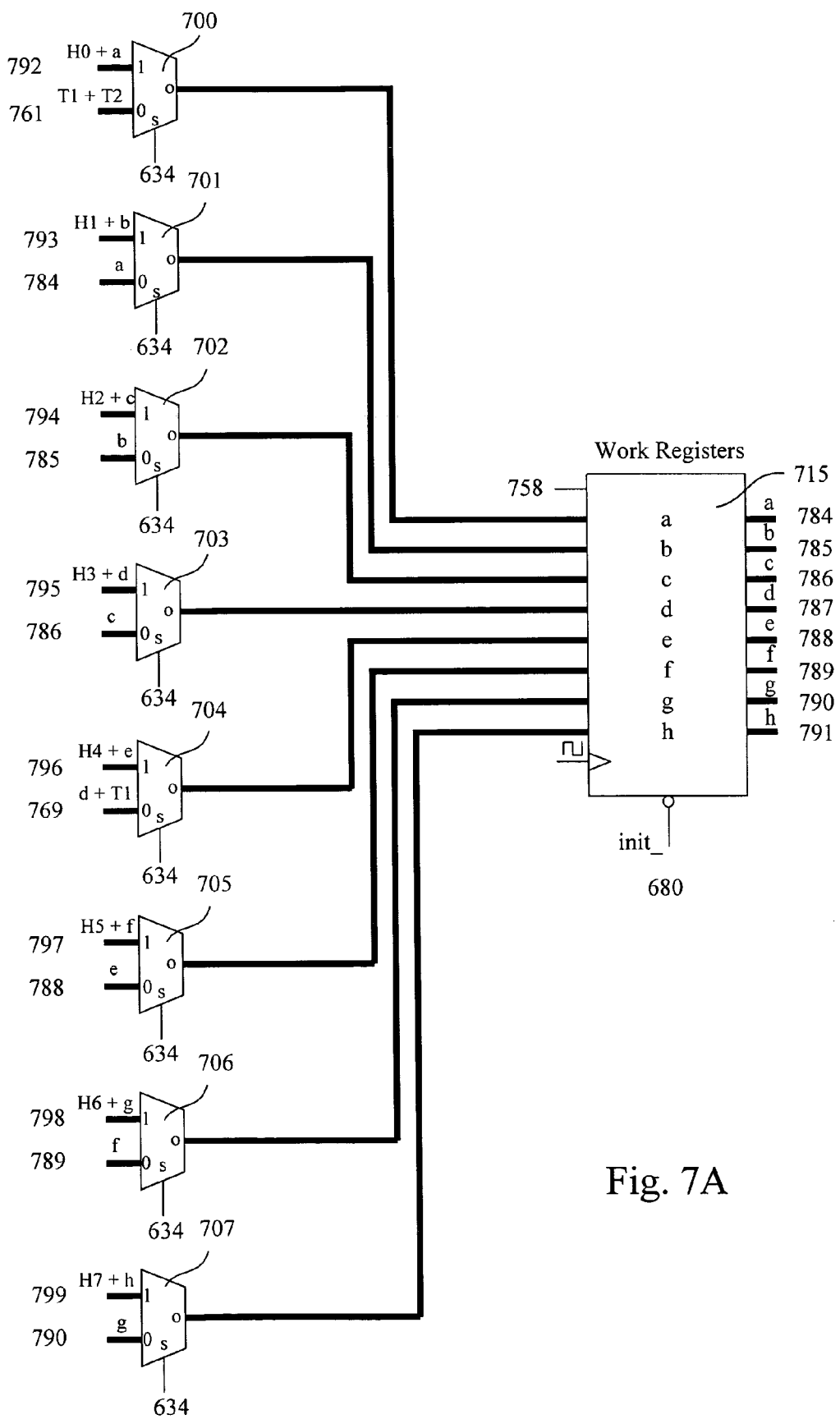
FIG. 7A together with FIG. 7B show an example of detailed architectural diagram for the computation unit 600.
Figure 7B:
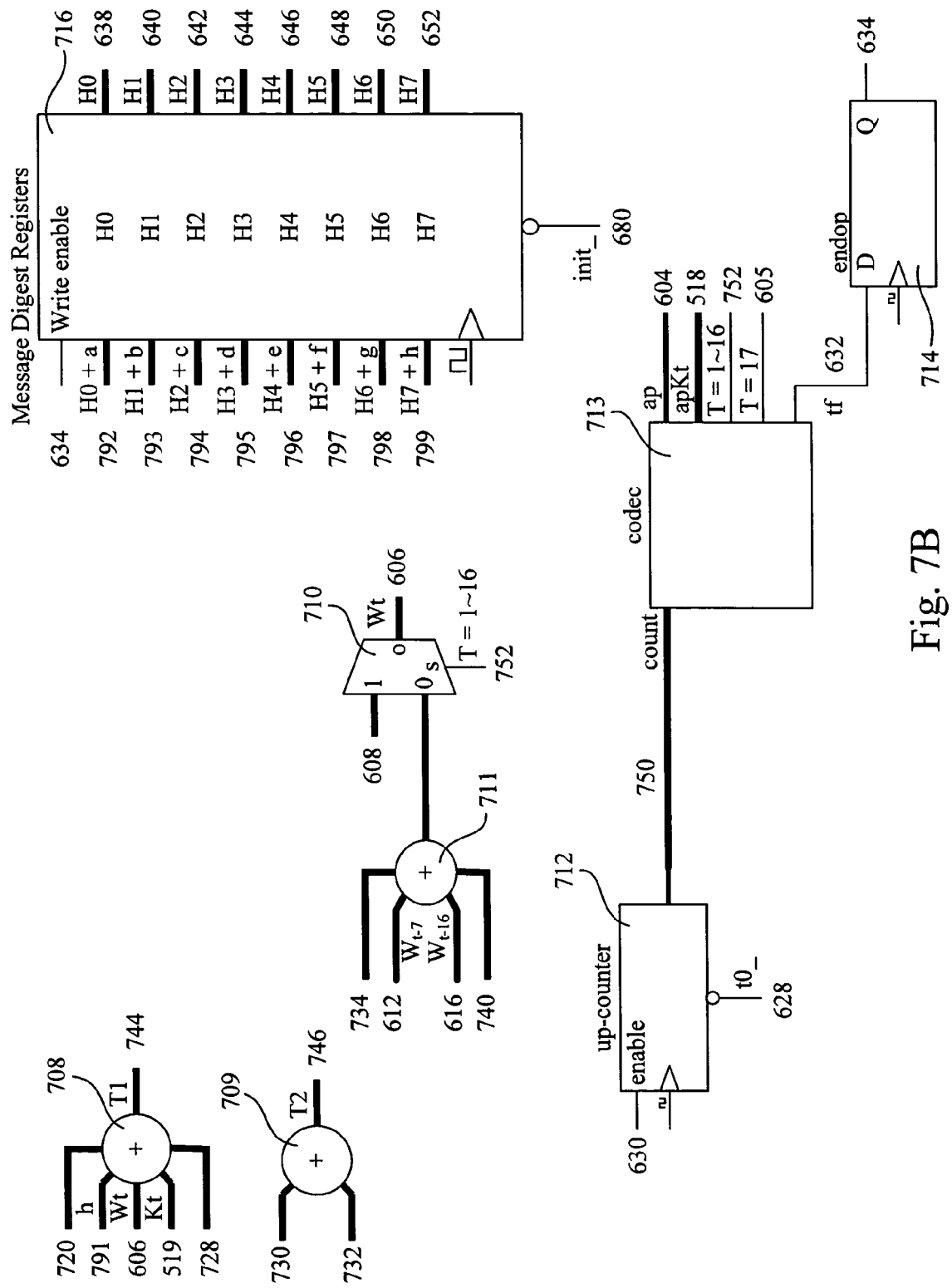

FIG. 7A combined with FIG. 7B shows an example of detailed architectural diagram for the SHS hash computation unit 600 for implementing SHA-224, SHA-256, SHA-384, or SHA-512; architectural similarities to the prior art (U.S. Ser. No. 10/704,678)—implementing SHA-1—are clearly evident when looking at the drawing. The architectural similarities shared with the prior art (U.S. Ser. No. 10/704, 678) include:

1. Implementing two sets of eight synchronous registers 715 and 716, each register has a width of either 32-bit (SHA-256 or SHA-224) or 64-bit (SHA-512 or SHA-384). One set—the Work Registers 715- to store the intermediate values given by each sequence of the first sixty-four (SHA-256 or SHA-224) or the first eighty (SHA-512 or SHA-384) sequences of the hash computation. The other set—the Message Digest Registers 716—to buffer the starting hash value till the final hash computation sequence (T=65 for SHA-256 and SHA-224 or T=81 for SHA-512 and SHA-384) where the value of the Work Registers 715 are add to the value of the Message Digest Registers 716 and the sum stored back to both register sets.
2. Implementing an asynchronous circuit 700~711 for processing the first sixty-four (SHA-256 or SHA-224) or the first eighty (SHA-512 or SHA-384) sequences of the hash computation; each computation sequence will finish within the time period of one clock; the intermediate result of each sequence will be stored into the Work Registers 715 and the stored values are fed back to the asynchronous computation circuit 700~711 to be used by the next hash computation sequence.
3. Tracking, counting, and controlling the hash computation sequences (65 sequences for SHA-256 and SHA-224 or 81 sequences for SHA-512 and SHA-384) with an up-counter 712, an encoder/decoder unit 713, and a D-flip-flop 714.

A detail description of the SHA-224/SHA-256/SHA-384/SHA-512 hash computation core architecture will now be presented. An up-counter 712 is implemented; this up-counter is 6-bit wide when implementing SHA-256 or SHA-224 and 7-bit wide when implementing SHA-512 or SHA-384. When the run signal (connection line 630) (from an external source) is active, the up-counter 712 provides a sequence count. The t0_signal (connection line 628) (also from an external source) clears the counter value to zero. Output (connection line 750) of the up-counter 712 is connected to an encoder/decoder (codec) circuit 713. The codec 713 generates several signals with the sequence value provided by up-counter 712; these signals are used to control the entire hash computation processes within the hash computation core. A detailed description of the codec 713 output signals now follows.

1. ap (connection line 604): Connected directly to the up-counter's (712) bit0 to bit3 outputs, it is an address pointer connected to QCOM 601 for retrieving appropriate message word (T=1 to T=16) or Wt-2, Wt-7, Wt-15, and Wt-16 data parameters (T=17 to T=64 for SHA-256/SHA-224 or T=17 to T=80 for SHA512/SHA-384) during a sequence of the hash computation; during T=17 to T=64 (SHA-256/SHA-224) or T=80 (SHA-512/SHA-384), the value of Wt (710) is also written to a QCOM 601 word pointed by ap (connection line 604).
2. apKt (connection line 518): A 6-bit output for SHA-256 and SHA-224 implementations or a 7-bit output for SHA-512 and SHA-384 implementations, it is connected directly to all output bits of the up-counter 712. It is an address pointer connected to a memory unit—with the Kt parameter of all sequences stored within KROM 530— for retrieving a Kt parameter corresponding to the hash computation sequence represented by apkt.

3. T=1~16 (connection line 752): This signal is active from T=1 to T=16. It is connected to the Wt multiplexer 710, during T=1 to T=16, the Wt0_15 (connection line 608) input is selected by this signal.

4. T=17 (t16) (connection line 605): This signal indicates the hash computation is in the 17th sequence. It is connected to an external S/R latch 602 to enable writing to QCOM 601.

5. tf (connection line 632): This signal represents T=64 when implementing SHA-256 or SHA-224 and T=80 when implementing SHA-512 or SHA-384. It is also connected to a D-flip-flop 714 to generate the endop signal (connection line 634) representing T=65 when implementing SHA-256 or SHA-224 and T=81 when implementing SHA-512 or SHA-384. Signal ff (connection line 632) can be used by external control unit—with edge triggered design—to deactivate the run signal (connection line 630) at the end of T=64 (SHA-256/SHA-224) or T=80 (SHA-512/SHA-384), so the run signal (connection line 630) is active from T=1 to T=64 when implementing SHA-256/SHA-224 or from T=1 to T=80 when implementing SHA-512/SHA-384. Signal endop can also be used to deactivate the run signal (connection line 630) if the run signal (connection line 630) is generated by a latch.

The endop signal (connection line 634) enables writing to the Message Digest Registers 716 and the Work Registers 715 when T=65 (SHA-256/SHA-224) or T=81 (SHA-512/SHA-384); the mathematic computation results of H0+a, H1+b, H2+c, H3+d, H4+e, H5+f, H6+g, and H7+h (connection line 792-799) from eight adder circuits are written respectively to H0, H1, H2, H3, H4, H5, H6, H7 (connection line 638-652) of the Message Digest Registers and to a, b, c, d, e, f, g, h (connection line 784~791) of the Work Registers 715 through eight multiplexers (700~707)—the select signals of which (700~707) are also connected to endop (connection line 634). When endop (connection line 634) is active, H0+a, H1+b, H2+c, H3+d, H4+e, H5+f, H6+g, and H7+h (connection line 792~799) are selected to pass through the eight multiplexers (700~707) to be written into the Work Registers 715; otherwise, values T1+T2 (connection line 761), a (connection line 784), b (connection line 785), c (connection line 786), d+T1 (connection line 769), e (connection line 788), f (connection line 789), g (connection line 790) pass through the eight multiplexers (700~707) and are written into a, b, c, d, e, f, g, h registers respectively when the Work Registers 715 are enabled—for write operation—by the run signal (connection line 630). Connection line 758 represents (run|endop). Connection line 758 can be used to enable writing to Work Registers 715.

Prior to starting hash computation on the first message block, the Message Digest Registers 716 and the Works Registers 715 are initialized to a set of initial hash values as shown in the initialization table (715, 716). SHA-224, SHA-256, SHA-384, and SHA-512 each has a different set of initial hash values, these are specified in the FIPS PUB 180-2 (Federal Information Processing Standards Publication 180-2) and are identical to the hexadecimal values shown in the initialization tables; and the Message Digest Registers and the Work Registers use the same set of initial hash values. Signal init_(connection line 680) initializes the Message Digest Registers 716 and the Work Registers 715 to the initial hash values when activated by external source.

The initialization tables:

| Initialization Table | Initialization Table |
| --- | --- |
| SHA-256: | SHA-256: |
| a = 0x6A09E667 | H0 = 0x6A09E667 |
| b = 0xBB67AE85 | H1 = 0xBB67AE85 |
| c = 0x3C6EF372 | H2 = 0x3C6EF372 |
| d = 0xA54FF53A | H3 = 0xA54FF53A |
| e = 0x510E527F | H4 = 0x510E527F |
| f = 0x9B05688C | H5 = 0x9B05688C |
| g = 0x1F83D9AB | H6 = 0x1F83D9AB |
| h = 0x5BE0CD19 | H7 = 0x5BE0CD19 |
| SHA-224: | SHA-224: |
| a = 0xC1059ED8 | H0 = 0xC1059ED8 |
| b = 0x367CD507 | H1 = 0x367CD507 |
| c = 0x3070DD17 | H2 = 0x3070DD17 |
| d = 0xF70E5939 | H3 = 0xF70E5939 |
| e = 0xFFC00B31 | H4 = 0xFFC00B31 |
| f = 0x68581511 | H5 = 0x68581511 |
| g = 0x64F98FA7 | H6 = 0x64F98FA7 |
| h = 0xBEFA4FA4 | H7 = 0xBEFA4FA4 |
| SHA-512: | SHA-512: |
| a = 0x6A09E667F3BCC908 | H0 = 0x6A09E667F3BCC908 |
| b = 0xBB67AE8584CAA73B | H1 = 0xBB67AE8584CAA73B |
| c = 0x3C6EF372FE94F82B | H2 = 0x3C6EF372FE94F82B |
| d = 0xA54FF53A5F1D36F1 | H3 = 0xA54FF53A5F1D36F1 |
| e = 0x510E527FADE682D1 | H4 = 0x510E527FADE682D1 |
| f = 0x9B05688C2B3E6C1F | H5 = 0x9B05688C2B3E6C1F |
| g = 0x1F83D9ABFB41BD6B | H6 = 0x1F83D9ABFB41BD6B |
| h = 0x5BE0CD19137E2179 | H7 = 0x5BE0CD19137E2179 |
| SHA-384: | SHA-384: |
| a = 0xCBBB9D5DC1059ED8 | H0 = 0xCBBB9D5DC1059ED8 |
| b = 0x629A292A367CD507 | H1 = 0x629A292A367CD507 |
| c = 0x9159015A3070DD17 | H2 = 0x9159015A3070DD17 |
| d = 0x152FECD8F70E5939 | H3 = 0x152FECD8F70E5939 |
| e = 0x67332667FFC00B31 | H4 = 0x67332667FFC00B31 |
| f = 0x8EB44A8768581511 | H5 = 0x8EB44A8768581511 |
| g = 0xDB0C2E0D64F98FA7 | H6 = 0xDB0C2E0D64F98FA7 |
| h = 0x47B5481DBEFA4FA4 | H7 = 0x47B5481DBEFA4FA4 |

The asynchronous circuits required for performing SHA-224, SHA-256, SHA-384, or SHA-512 mathematic and logic operations will now be described.

1. Eight adders to perform the mathematic operations of H0+a, H1+b, H2+c, H3+d, H4+e, H5+f, H6+g, and H7+h; the result of which are written synchronously (on a clock edge)—and when the endop signal (connection line 634) is active—into both the Message Digest Registers (716) and the Work Registers (715) through the eight multiplexers (700~707). Since adders are widely understood art in the field of electrical engineering, the aforementioned circuits are not drawn in FIG. 7A or FIG. 7B. In essence, the aforementioned description accomplishes the mathematic operations of H0=a=H0+a, H1=b=H1+b, H2=c=H2+c, H3=d=H3+d, H4=e=H4+e, H5=f=H5+f, H6=g=H6+g, H7=h=H7+h on a clock edge when T=65 when implementing SHA-256 or SHA-224 or when T=81 when implementing SHA-512 or SHA-384.

2. During T=1 to T=64 in SHA-256 and SHA-224 or T=1 to T=80 in SHA-512 and SHA-384; or in other words, when the run signal is active; the mathematic operations of a=T1+T2, b=a, c=b, d=c, e=d+T1, f=e, g=f, h=g takes place (700~707 and 715). Two word size adders (32-bit for SHA-256 and SHA-224 or 64-bit for SHA-512 and SHA-384) are implemented to accomplish T1+T2 (761) and d+T1 (769).

3. T1 (connection line 744) is the sum of five data parameters: $\Sigma1(e)$ (connection line 720), h (connection line 791), Wt (connection line 606), Kt (connection line 519), and Ch(e,f,g) (connection line 728); a five parameter asynchronous adder circuit 708 can be implemented to perform the T1=$\Sigma1(e)$+h+Wt+Kt+Ch(e,f,g) mathematic operations. When implementing SHA-256 or SHA-224, $\Sigma1(e)$=(e>>>6)^(e>>>11)^(e>>>25); when implementing SHA-512 or SHA-384, $\Sigma1(e)$=(e>>>14)^(e>>>18)^(e>>>41). Symbol ^ represents an XOR operation and >>> symbol represents a right-rotate operation of the number of bits presented by the number at the right hand side of the symbol. Right-rotate and XOR circuits are well known arts in the field of electrical engineering; they will not be described further here. Parameter h is a register output from the Work Registers 715; Wt is from a multiplexer 710; Kt is from KROM 530 where Kt values of all sequences are stored; and Ch(e,f,g) is a function where Ch(e,f,g)=(e & f)^(~e & g). The symbol & represents a logical AND and ~ represents a NOT. Logic circuits of performing AND and NOT are also well known art; they will not be described further.
4. A two-input adder 709 can be implemented to perform T2 (connection line 746)=$\Sigma0(a)$ (connection line 730)+Maj(a,b,c) (connection line 732). When implementing SHA-256 or SHA-224, $\Sigma0(a)$=(a>>>2)^(a>>>13)^(a>>>22); when implementing SHA-512 or SHA-384, $\Sigma0(a)$=(a>>>28) ^(a>>>34)^(a>>>39). Maj(a,b,c)=(a & b)^(a & c)^(b & c).
5. A two-input multiplexer 710 is implemented to select an appropriate source of the Wt data parameter. From T=1 to T=16 (for SHA-1, SHA-224, SHA-256, SHA-384, and SHA-512), Wt (connection line 606) comes directly from QCOM 601 and is a word out of sixteen words of a message block; otherwise, Wt is the output of a four parameter adder 711.
6. Output of the four parameter adder 711 is the sum of σ1(Wt-2) (connection line 734), Wt-7 (connection line 612), σ0(Wt-15) (connection line 740), and Wt-16 (connection line 616). In other words, from T=17 to T=64 for SHA-256 and SHA-224 or from T=17 to T=80 for SHA-512 and SHA-384: Wt (connection line 606)=σ1(Wt-2)+Wt-7+σ0(Wt-15)+Wt-16. For SHA-256 and SHA-224, σ1(Wt-2)=(Wt-2>>>17)^(Wt-2>>>19)^(Wt-2>>10) and σ0(Wt-15) (connection line 740)=(Wt-15>>>7)^(Wt-15>>>18)^(Wt-15>>3). For SHA-512 and SHA-384, σ1(Wt-2)=(Wt-2>>>19)^(Wt-2>>>61)^(Wt-2>>6) and σ0(Wt-15)=(Wt-15>>>1)^(Wt-15>>>8)^(Wt-15>>7). Symbol >> represents a right-shift of the number of bits presented by the number at the right hand side of the symbol.

The asynchronous circuits (700~711) for performing SHA-224, SHA-256, SHA-384, or SHA-512 logic and mathematic operations along with using a memory block—preferably a ROM (read-only memory) (KROM 530)—for storing the Kt constants of all the hash computation sequences and using apKt (connection line 518) to retrieve the Kt corresponding to a hash computation sequence, these are the main differences to the prior art, allowing the new SHS algorithms (SHA-224, SHA-256, SHA-384, or SHA-512) implemented with similar system and method of efficiently implementing Secure Hash Algorithm in digital hardware that accomplishes optimal computation speed using minimal hardware resources—as claimed in the prior art (U.S. Ser. No. 10/704,678). This system of efficiently implementing Secure Hash Algorithm—with the new asynchronous logic and mathematic circuits (700~711) and the KROM 530 to supply Kt constant according to the apKt (connection line 518) value—can complete a SHA-256 or SHA-224 computation on a 512-bit message block in exactly 65 clock cycles; or for SHA-512 or SHA-384, a hash computation on a 1024-bit message block can complete in exactly 81 clock cycles.

An AMBIST system with a SHS based hash computation core can be an efficient and reliable memory test system that save test time and reduce complexity of the overall test systems.

The invention has at least the following advantages. The method described in the invention can significantly reduce the test time, the cost, and the complexity of external test system. The method can provide both Automatic Test Pattern Generation (ATPG) and Accelerated Test Method (ATM) verification solutions. The method generates a set of hash data pattern and the inverted value of the same set of hash data pattern to effectively detect "stuck-at" (logic-1 or logic-0) faults. The method uses a hash algorithm to generate a signature representing the response data so that the test complexity is significantly reduced. The test system described in the invention can be easily integrated into a chip containing the memory.

Although the present invention has been described in considerable detail with reference to certain preferred embodiments thereof, other embodiments are possible. Therefore, their spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for testing a memory embedded in an on-chip system comprising an accelerated memory built-in self-test (AMBIST) device, the method comprising:
    generating a test pattern by a hash algorithm in the AMBIST device;
    writing the test pattern into the memory by the AMBIST device;
    reading the test pattern from the memory to the AMBIST device;
    generating a signature by the hash algorithm in the AMBIST device using the test pattern read from the memory; and
    verifying the memory by comparing the signature to a reference signature.

2. The method of claim 1, wherein the hash algorithm comprises a SHA (Secure Hash Algorithm).

3. The method of claim 2, wherein the hash algorithm is selected from the group consisting of SHA-1, SHA-224, SHA-256, SHA-384, and SHA-512.

4. The method of claim 2, further comprising:
    using a ROM in the AMBIST device to store a plurality of Kt parameters, the Kt parameters being used when performing the hash algorithm, wherein the Kt parameters are defined in FIPS PUB 180-2 (Federal Information Processing Standards Publication 180-2).

5. The method of claim 1, wherein the hash algorithm comprises a MD5 (Message-Digest 5) algorithm.

6. The method of claim 1, further comprising:
using a message block buffer in the AMBIST device to store a message block.

7. The method of claim 6, further comprising:
using a seed as the message block for the hash algorithm; and
taking the message block as an input to perform the hash algorithm in the AMBIST device to generate an initial hash value as the test pattern.

8. The method of claim 6, further comprising:
using a seed as the message block for the hash algorithm;
taking the message block as an input to perform the hash algorithm in the AMBIST device to generate an initial hash value; and
expanding the initial hash value to obtain an expanded initial hash value as the test pattern.

9. The method of claim 8, wherein the length of the expanded initial hash value is the same as the length of the message block.

10. The method of claim 9, further comprising:
using the expanded initial hash value as an input to perform the hash algorithm in the AMBIST device to generate a second hash value;
expanding the second hash value to equal to the length of the message block as the test pattern by the AMBIST device; and
writing the test pattern into the memory by the AMBIST device.

11. The method of claim 10, further comprising:
repeatedly generating next hash value by the hash algorithm in the AMBIST device using the previously expanded hash value;
expanding each next hash value as the test pattern by the AMBIST device; and
writing the test pattern into the memory by the AMBIST device until the memory is full.

12. The method of claim 11, wherein the step of expanding each next hash value is performed by steps comprising:
inverting the next hash value as an inverted next hash value;
concatenating the next hash value and the inverted next hash value to make an expanded hash value with the length equal to the length of the message block.

13. The method of claim 12, further comprising:
if the memory is full, reading the expanded initial hash value from the memory to the AMBIST device; and
taking the expanded initial hash value read from the memory as an input to perform the hash algorithm in the AMBIST device to generate next hash value.

14. The method of claim 13, further comprising:
reading each expanded hash value from the memory to the AMBIST device; and
repeatedly taking each expanded hash value previously read from the memory as an input to perform the hash algorithm in the AMBIST device to generate next hash value until the last expanded hash value is read from the memory and the last hash value is generated using the last expanded hash value.

15. The method of claim 14, further comprising:
taking the last hash value generated by the hash algorithm in the AMBIST device as the signature; and
comparing the signature to a reference signature to determine whether any fault occurs in the memory.

16. A method for testing a plurality of memory blocks of a memory embedded in an on-chip system comprising an accelerated memory built-in self-test (AMBIST) device, the method comprising:
generating a plurality of test patterns by a hash algorithm in the AMBIST device for the memory blocks respectively;
writing the test patterns into the memory blocks respectively by the AMBIST device;
reading the test patterns out from the memory blocks respectively to the AMBIST device;
generating a first signature via the hash algorithm in the AMBIST device by sequentially using the test patterns read from the memory blocks;
verifying the memory blocks as a whole by comparing the first signature to a first reference signature;
generating a plurality of inverted test patterns by the hash algorithm in the AMBIST device for the memory blocks respectively;
writing the inverted test patterns into the memory blocks respectively by the AMBIST device;
reading the inverted test patterns out from the memory blocks respectively by the AMBIST device;
generating a second signature via the hash algorithm in the AMBIST device by sequentially using the inverted test patterns read from the memory blocks; and
verifying the memory blocks as a whole by comparing the second signature to a second reference signature.

17. The method of claim 16, the step of generating the test patterns further comprising:
using a seed as a message block for the hash algorithm;
generating an initial hash value by the hash algorithm;
expanding the initial hash value to obtain an expanded initial hash value as the first test pattern of the test patterns for the first memory block of the memory block wherein the first test pattern is then written into the first memory block and the message block.

18. The method of claim 17, the step of generating the test patterns further comprising:
using the expanded initial hash as an input to perform the hash algorithm to generate a second hash value;
expanding the second hash value to equal the length of the message block as the second test pattern of the test patterns for the second memory block of the memory blocks, wherein the second test pattern is then written into the second memory block and the message block.

19. The method of claim 18, the step of generating the test patterns further comprising:
repeatedly generating next hash value by the hash algorithm using the previously expanded hash value; and
expanding each generated hash value as the test pattern for each of the remaining memory blocks, wherein each expanded hash value is written into the corresponding memory block and the message block until the last memory block is reached.

20. The method of claim 19, wherein the step of expanding each generated hash value is performed by steps comprising:
inverting the generated hash value as an inverted hash value;
concatenating the generated hash value and the inverted hash value to make an expanded hash value with the length equal to the length of the message block.

21. The method of claim 20, wherein the inverted test pattern is generated by steps comprising:
reinitializing the hash algorithm using the same seed; and
swapping the positions of the hash value and the inverted hash value in the expanded hash value.

22. The method of claim 19, wherein, after the step of writing the test patterns into the memory blocks, the method further comprises:

if the last memory block of the memory blocks is reached, reading the expanded initial hash value from the first memory block to the AMBIST device; and taking the expanded initial hash value read from the first memory block as an input to perform the hash algorithm in the AMBIST device to generate next hash value.

23. The method of claim 22, further comprising:

reading each expanded hash value from the corresponding memory block to the AMBIST device; and repeatedly taking each expanded hash value previously read from the corresponding memory block as an input to perform the hash algorithm in the AMBIST device to generate next hash value until the last expanded hash value is read from the memory blocks and the last hash value is generated using the last expanded hash value.

24. An on-chip system, comprising:

a memory;

an accelerated memory built-in self-test (AMBIST) device, comprising:

means for generating a test pattern by a hash algorithm, the test pattern being written into the memory; and means for generating a signature by the hash algorithm using the test pattern read from the memory;

wherein the signature is used for comparison to a reference signature to determine whether any fault occurs during the write-read operation of the memory.

25. The on-chip system of claim 24, wherein the hash algorithm comprises a SHA (Secure Hash Algorithm).

26. The on-chip system of claim 25, wherein the hash algorithm is selected from the group consisting of SHA-1, SHA-224, SHA-256, SHA-384, and SHA-512.

27. The on-chip system of claim 25, wherein AMBIST) device further comprises:

a ROM for storing a plurality of Kt parameters, the Kt parameters being used when performing the hash algorithm, wherein the Kt parameters are defined in FIPS PUB 180-2 (Federal Information Processing Standards Publication 180-2).

28. The on-chip system of claim 24, wherein the hash algorithm comprises a MD5 (Message-Digst 5) algorithm.

29. The on-chip system of claim 24, wherein the AMBIST) device further comprises a message block buffer for storing a message block, the message block being taken as an input to perform the hash algorithm.

30. The on-chip system of claim 24, wherein the AMBIST) device further comprises an adder circuit, and the adder circuit performs:

(i) $\Sigma 1(e)$+h+Wt+Kt+Ch(e,f,g);

(ii) when implementing SHA-256 or SHA-224, $\Sigma 1(e)$= $(e\ggg 6)\char`^(e\ggg 11)\char`^(e\ggg 25)$;

(iii) when implementing SHA-512 or SHA-384, $\Sigma 1(e)$= $(e\ggg 14)\char`^(e\ggg 18)\char`^(e\ggg 41)$; and (iv) Ch(e,f,g)=(e & f)$\char`^$(~e & g);

wherein e, h, Wt, Kt, f, and g are parameters defined in FIPS PUB 180-2, and symbol $\char`^$ represents an XOR operation, and symbol >>> represents a right-rotate operation of the number of bits presented by the number at the right hand side of the symbol, and symbol & represents a logical AND.

31. The on-chip system of claim 24, wherein the AMBIST) device further comprises an adder circuit, and the adder circuit performs:

(i) $\Sigma 0(a)$+Maj(a,b,c);

(ii) when implementing SHA-256 or SHA-224, $\Sigma 0(a)$= $(a\ggg 2)\char`^(a\ggg 13)\char`^(a\ggg 22)$;

(iii) when implementing SHA-512 or SHA-384, $\Sigma 0(a)$= $(a\ggg 28)\char`^(a\ggg 34)\char`^(a\ggg 39)$; and (iv) Maj(a,b,c)=(a & b)$\char`^$(a & c)$\char`^$(b & c);

wherein a, b, and c are parameters defined in FIPS PUB 180-2 and symbol $\char`^$ represents an XOR operation, and symbol >>> represents a right-rotate operation of the number of bits presented by the number at the right hand side of the symbol, and symbol & represents a logical AND.

32. The on-chip system of claim 24, wherein the AMBIST) device further comprises an adder circuit, and the adder circuit performs:

(i) $\sigma 1(Wt\text{-}2)$+Wt-7+$\sigma 0(Wt\text{-}15)$+Wt-16;

(ii) when implementing SHA-256 or SHA-224, $\sigma 1(Wt\text{-}2)$=(Wt-2>>>17)$\char`^$(Wt-2>>>19)$\char`^$(Wt-2>>10) and $\sigma 0(Wt\text{-}15)$=(Wt-15>>>7)$\char`^$(Wt-15>>>18$\char`^$(Wt-15>>3); and (iii) when implementing SHA-512 or SHA-384, $\sigma 1(Wt\text{-}2)$=(Wt-2>>>19$\char`^$(Wt-2>>>61)$\char`^$(Wt-2>>6) and $\sigma 0(Wt\text{-}15)$=(Wt-15>>>1)$\char`^$(Wt-15>>>8)$\char`^$(Wt-15>>7);

wherein Wt-2, Wt-7, Wt-15, and Wt-16 are parameters defined in FIPS PUB 180-2, and symbol $\char`^$ represents an XOR operation, and symbol >>> represents a right-rotate operation of the number of bits presented by the number at the right hand side of the symbol, and symbol & represents a logical AND.

33. The on-chip system of claim 32, wherein the AMBIST) device further comprises a multiplexer for selecting a Wt value, and the Wt value is selected between the output of the adder circuit and Wt0_15, and Wt0_15 is a parameter defined in FIPS PUB 180-2.

34. The on-chip system of claim 24, wherein the AMBIST) device further comprises a codec circuit for generating an address for retrieving Kt parameters for performing the hash algorithm, and the Kt parameters are defined in FIPS PUB 180-2.

* * * * *